(12) United States Patent
Camacho

(10) Patent No.: US 9,177,832 B2
(45) Date of Patent: Nov. 3, 2015

(54) SEMICONDUCTOR DEVICE AND METHOD OF FORMING A RECONFIGURED STACKABLE WAFER LEVEL PACKAGE WITH VERTICAL INTERCONNECT

(75) Inventor: Zigmund R. Camacho, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/234,535

(22) Filed: Sep. 16, 2011

(65) Prior Publication Data

US 2013/0069222 A1    Mar. 21, 2013

(51) Int. Cl.
| | |
|---|---|
| *H01L 21/48* | (2006.01) |
| *H01L 23/498* | (2006.01) |
| *H01L 23/538* | (2006.01) |
| *H01L 25/10* | (2006.01) |
| *H01L 23/00* | (2006.01) |
| *H01L 21/56* | (2006.01) |

(52) U.S. Cl.
CPC .......... *H01L 21/486* (2013.01); *H01L 21/561* (2013.01); *H01L 23/49827* (2013.01); *H01L 23/5389* (2013.01); *H01L 24/19* (2013.01); *H01L 24/24* (2013.01); *H01L 24/96* (2013.01); *H01L 24/97* (2013.01); *H01L 25/105* (2013.01); *H01L 21/568* (2013.01); *H01L 2224/0401* (2013.01); *H01L 2224/04105* (2013.01); *H01L 2224/12105* (2013.01); *H01L 2224/32145* (2013.01); *H01L 2224/32225* (2013.01); *H01L 2224/73267* (2013.01); *H01L 2224/92244* (2013.01); *H01L 2224/97* (2013.01); *H01L 2225/1035* (2013.01); *H01L 2225/1058* (2013.01); *H01L 2924/01322* (2013.01); *H01L 2924/12041* (2013.01); *H01L 2924/1306* (2013.01); *H01L 2924/13091* (2013.01); *H01L 2924/15747* (2013.01); *H01L 2924/18162* (2013.01); *H01L 2924/3511* (2013.01)

(58) Field of Classification Search
CPC ........................................ H01L 25/50
USPC ................. 438/106; 257/774, 776, 678, 621, 257/E21.502, E23.01, E21.211
See application file for complete search history.

(56) References Cited

U.S. PATENT DOCUMENTS

| | | | | |
|---|---|---|---|---|
| 4,383,363 A | * | 5/1983 | Hayakawa et al. | 29/847 |
| 6,001,671 A | * | 12/1999 | Fjelstad | 438/112 |
| 6,294,830 B1 | * | 9/2001 | Fjelstad | 257/724 |
| 6,306,685 B1 | * | 10/2001 | Liu et al. | 438/121 |
| 7,009,286 B1 | * | 3/2006 | Kirloskar et al. | 257/684 |
| 7,030,033 B2 | * | 4/2006 | Igarashi et al. | 438/754 |

(Continued)

*Primary Examiner* — Allen Parker
(74) *Attorney, Agent, or Firm* — Robert D. Atkins; Patent Law Group: Atkins and Associates, P.C.

(57) ABSTRACT

A semiconductor device has a carrier with a semiconductor die mounting area. A plurality of conductive posts is formed in a periphery of the semiconductor die mounting area and in the carrier. A first portion of the carrier is removed to expose a first portion of the plurality of conductive posts such that a second portion of the plurality of conductive posts is embedded in a second portion of the carrier. A first semiconductor die is mounted to the semiconductor die mounting area and between the first portion of the plurality of conductive posts. A first encapsulant is deposited around the first semiconductor die and around the first portion of the plurality of conductive posts. A second portion of the carrier is removed to expose the second portion of the plurality of conductive posts. An interconnect structure is formed over the plurality of conductive posts and the first semiconductor die.

28 Claims, 17 Drawing Sheets

(56) References Cited

U.S. PATENT DOCUMENTS

| | | | |
|---|---|---|---|
| 7,165,316 B2 * | 1/2007 | Fjelstad | 29/620 |
| 7,271,032 B1 * | 9/2007 | McLellan et al. | 438/111 |
| 7,473,586 B1 * | 1/2009 | Lo et al. | 438/127 |
| 7,528,053 B2 | 5/2009 | Huang et al. | |
| 7,595,225 B1 * | 9/2009 | Fan et al. | 438/112 |
| 7,888,181 B2 | 2/2011 | Camacho et al. | |
| 8,176,628 B1 * | 5/2012 | Rusli et al. | 29/852 |
| 2004/0092129 A1 * | 5/2004 | Igarashi et al. | 438/754 |
| 2004/0097086 A1 * | 5/2004 | Igarashi et al. | 438/690 |
| 2006/0046468 A1 * | 3/2006 | Akram et al. | 438/637 |
| 2008/0169548 A1 * | 7/2008 | Baek | 257/686 |
| 2009/0140394 A1 * | 6/2009 | Bathan et al. | 257/621 |
| 2010/0140771 A1 * | 6/2010 | Huang et al. | 257/686 |
| 2010/0144101 A1 * | 6/2010 | Chow et al. | 438/127 |
| 2011/0215449 A1 | 9/2011 | Camacho et al. | |
| 2011/0285007 A1 | 11/2011 | Chi et al. | |
| 2012/0038034 A1 | 2/2012 | Shin et al. | |

* cited by examiner

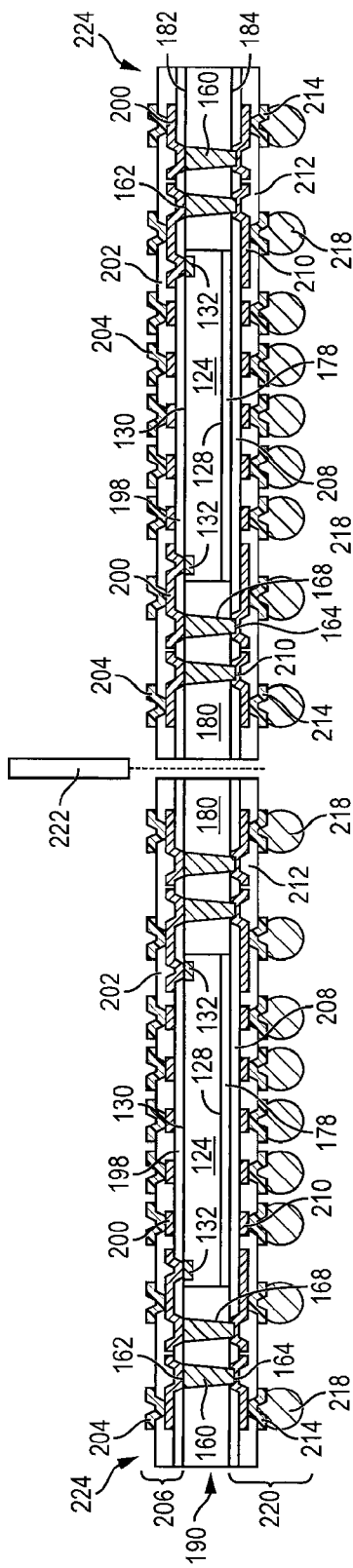
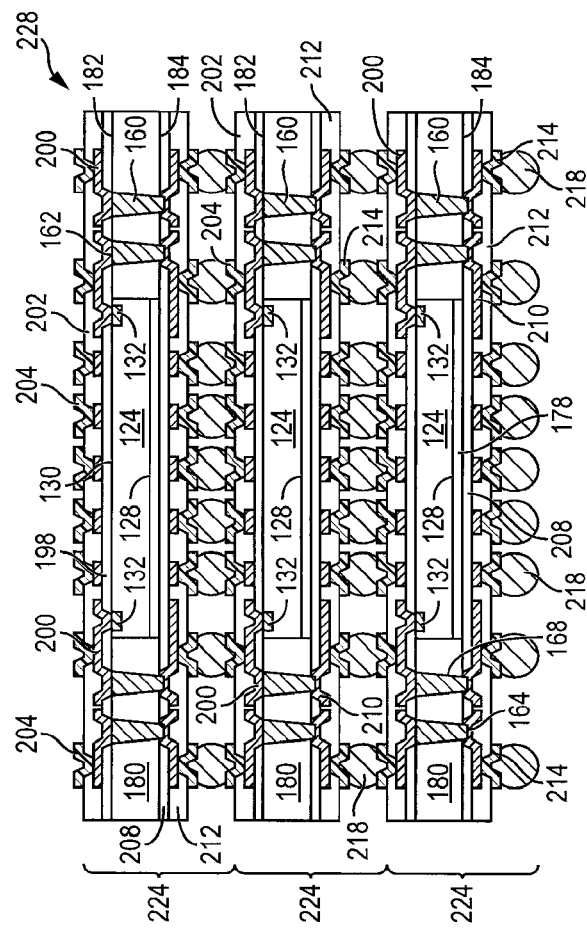
FIG. 4p
FIG. 5

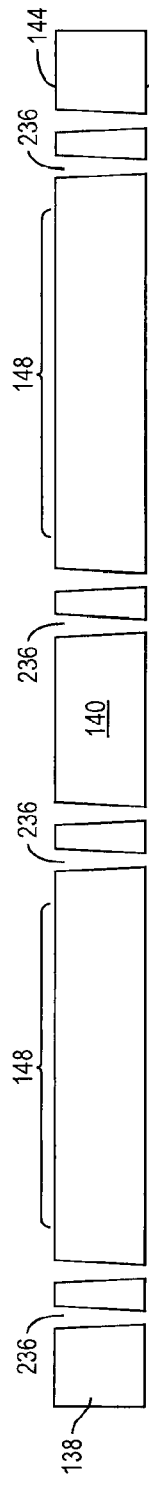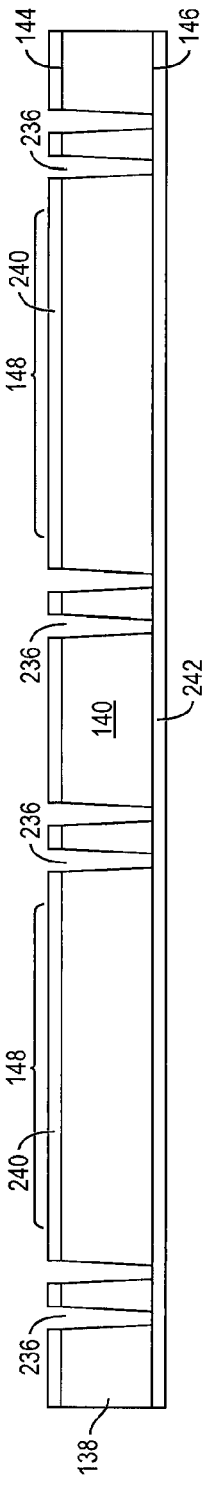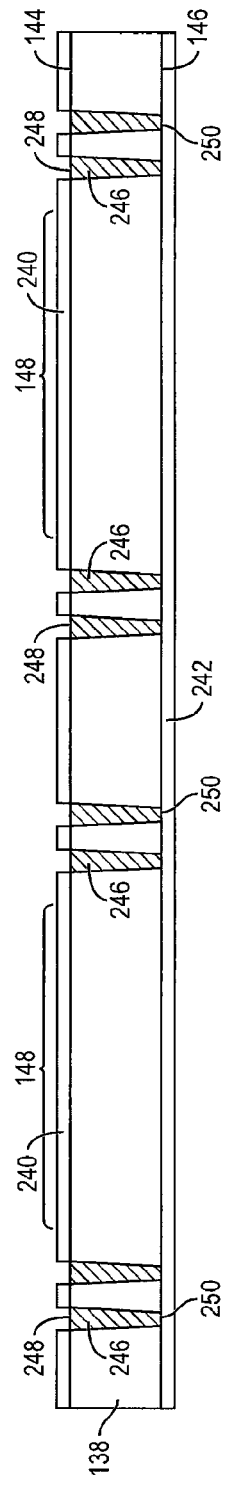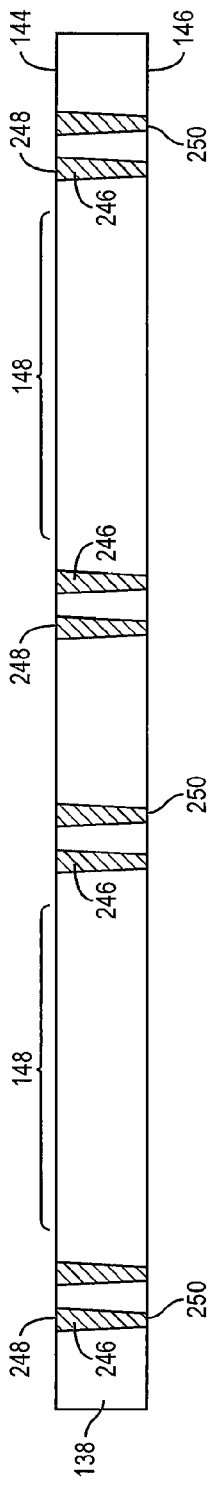

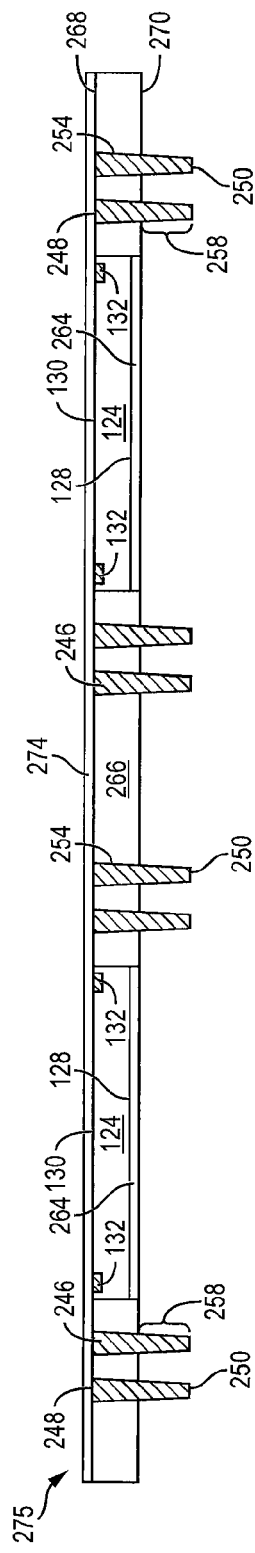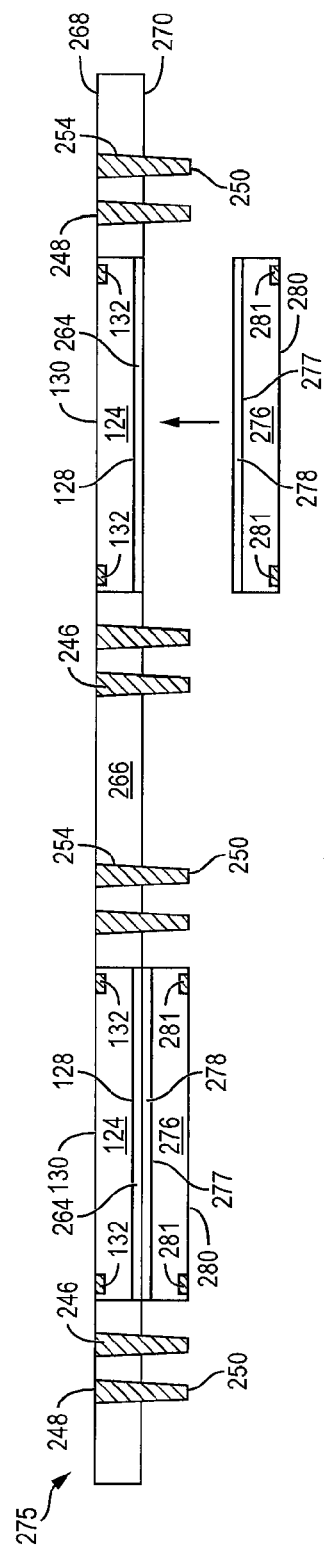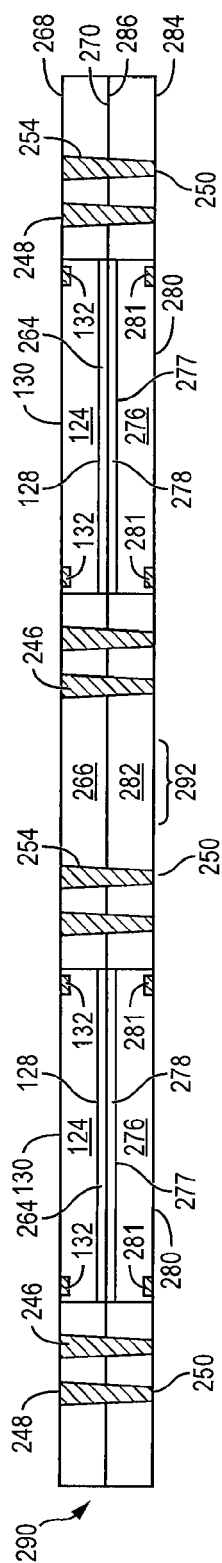
FIG. 6h
FIG. 6i
FIG. 6j

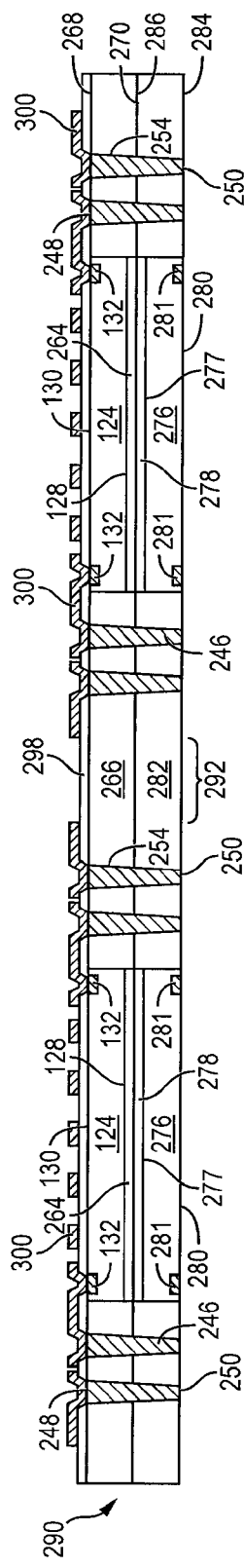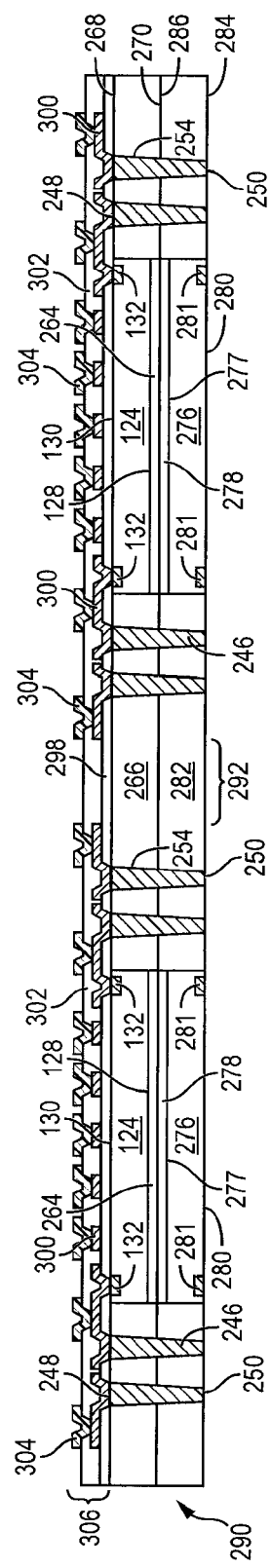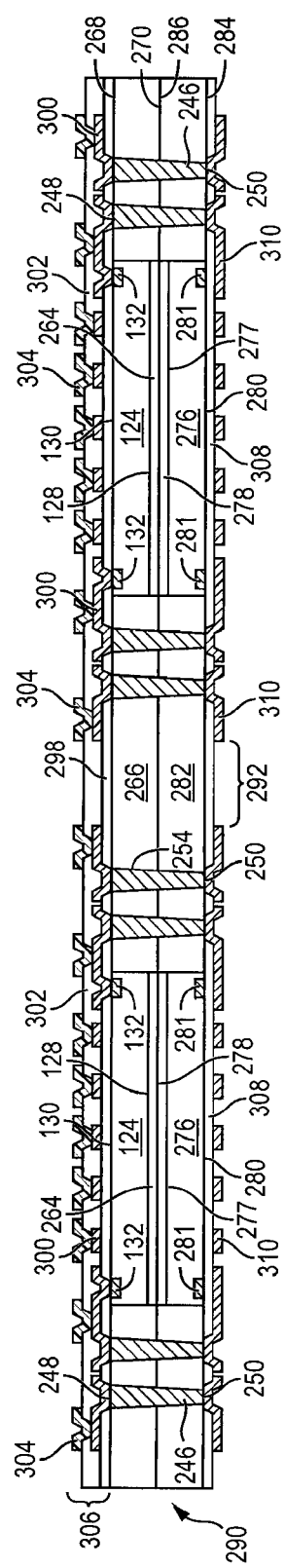

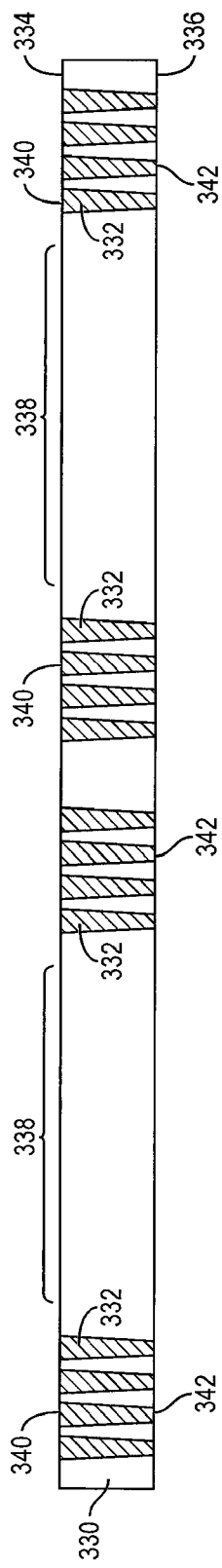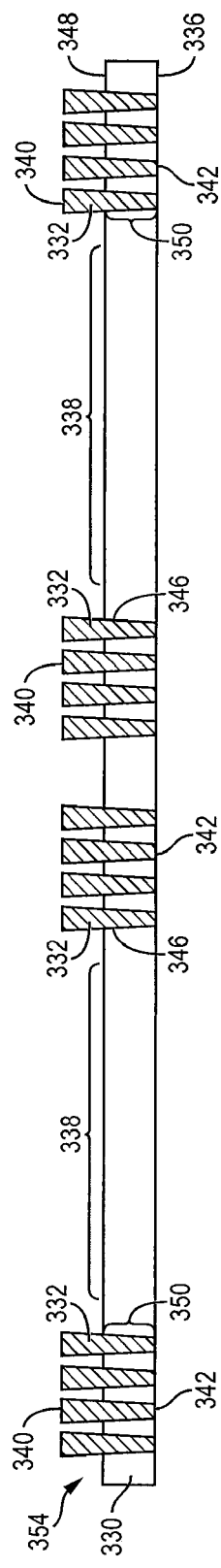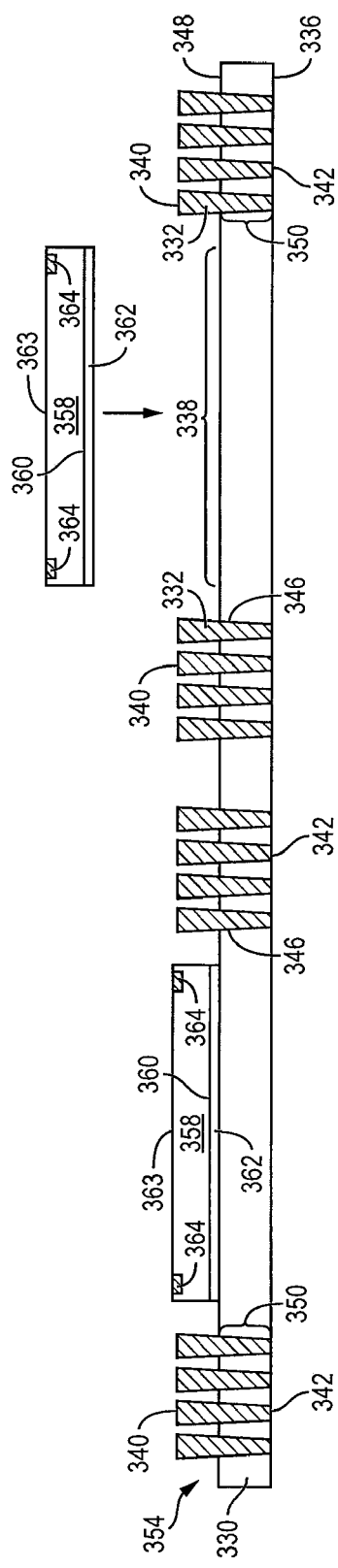

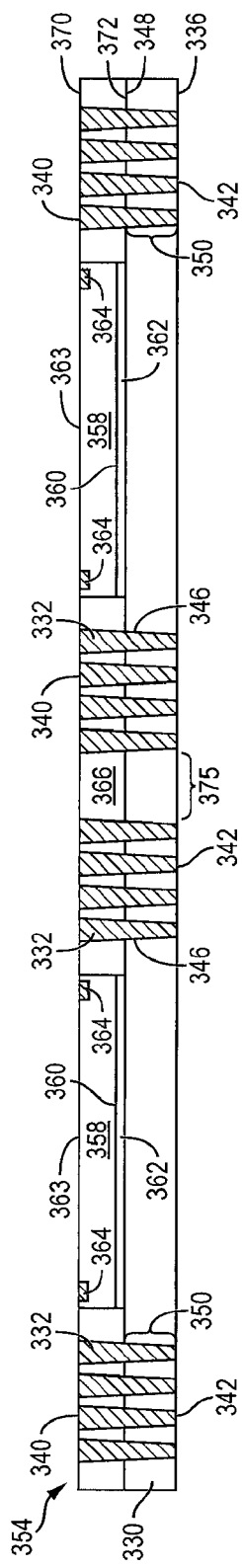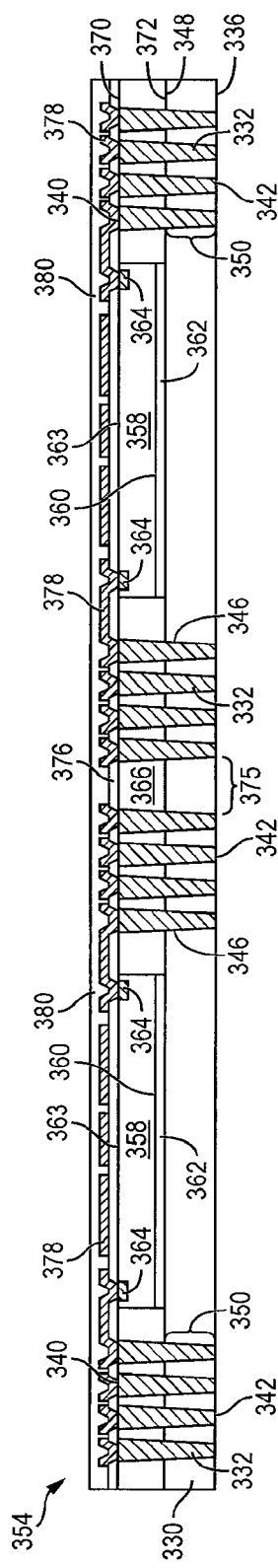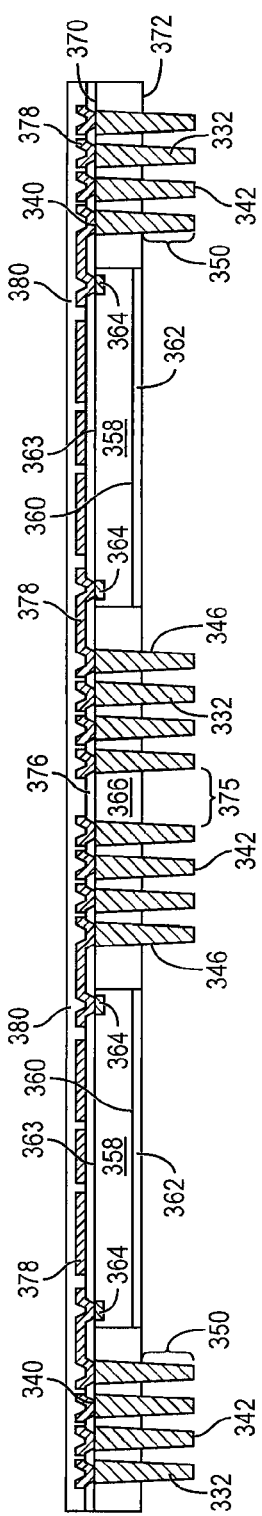

SEMICONDUCTOR DEVICE AND METHOD OF FORMING A RECONFIGURED STACKABLE WAFER LEVEL PACKAGE WITH VERTICAL INTERCONNECT

FIELD OF THE INVENTION

The present invention relates in general to semiconductor devices and, more particularly, to a semiconductor device and method of using a carrier to form a reconfigured stackable wafer level package having conductive posts for vertical interconnect of a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional wafer level chip scale package (WLCSP) may contain a semiconductor die mounted to a substrate and covered with an encapsulant. Conductive vias are formed through the encapsulant around the substrate for vertical electrical interconnect. Alternatively, through silicon vias (TSVs) are formed through the semiconductor die or in a periphery of the semiconductor die for vertical electrical interconnect. However, the formation of conductive vias including TSVs with lasers may involve a time-consuming plating process and is susceptible to voids and other defects. The defects lower manufacturing yield and increase cost. As a diameter of the conductive vias and TSVs increases, cycle-time and cost also increase.

In another conventional WLCSP, a leadframe is mounted over a semiconductor and substrate. The leadframe has vertical conductive bodies that are disposed over the substrate and around the semiconductor die. An encapsulant is deposited around the semiconductor die and conductive bodies. When the leadframe is singulated, the conductive bodies are electrically isolated as conductive vias within the encapsulant for vertical interconnect. Warpage is a principal concern for the WLCSP, as well as defects from electrical shorts.

SUMMARY OF THE INVENTION

A need exists for a simple and cost effective vertical electrical interconnect of a semiconductor die. Accordingly, in one embodiment, the present invention is a method of making a semiconductor device comprising the steps of providing a carrier with a semiconductor die mounting area, forming a plurality of vias in a periphery of the semiconductor die mounting area and in the carrier, depositing a conductive material in the plurality of vias to form a plurality of conductive posts, and removing a first portion of the carrier to expose a first portion of the plurality of conductive posts such that a second portion of the plurality of conductive posts is embedded in a second portion of the carrier. The method further includes the steps of mounting a first semiconductor die to the semiconductor die mounting area and between the first portion of the plurality of conductive posts, depositing a first encapsulant around the first semiconductor die and around the first portion of the plurality of conductive posts, removing the second portion of the carrier to expose the second portion of the plurality of conductive posts, forming an interconnect structure over the plurality of conductive posts and the first semiconductor die.

In another embodiment, the present invention is a method of making a semiconductor device comprising the steps of providing a carrier with a semiconductor die mounting area, forming a plurality of conductive posts in a periphery of the semiconductor die mounting area and in the carrier, removing a first portion of the carrier to expose a first portion of the plurality of conductive posts such that a second portion of the plurality of conductive posts is embedded in a second portion of the carrier, mounting a first semiconductor die over the semiconductor die mounting area and between the first portion of the plurality of conductive posts, depositing a first encapsulant around the first semiconductor die and around the first portion of the plurality of conductive posts, and removing the second portion of the carrier to expose the second portion of the plurality of conductive posts.

In another embodiment, the present invention is a method of making a semiconductor device comprising the steps of providing a carrier with a semiconductor die mounting area, forming a plurality of conductive posts in a periphery of the semiconductor die mounting area and in the carrier, and removing a first portion of the carrier to expose a first portion of the plurality of conductive posts such that a second portion of the plurality of conductive posts is embedded in a second portion of the carrier.

In another embodiment, the present invention is a semiconductor device comprising a carrier with a semiconductor die mounting area. A plurality of conductive posts is formed in a periphery of the semiconductor die mounting area and in the carrier such that a first portion of the plurality of conductive posts is exposed from the carrier and a second portion of the plurality of conductive posts is embedded in the carrier.

BRIEF DESCRIPTION OF THE DRAWINGS

FIG. 5 illustrates a package-on-package (PoP) arrangement of multiple packages having conductive posts for vertical interconnect;

FIGS. 7a-7g illustrate a method of using a carrier to form a stackable package having conductive posts for package interconnect.

DETAILED DESCRIPTION OF THE DRAWINGS

Figure 1:
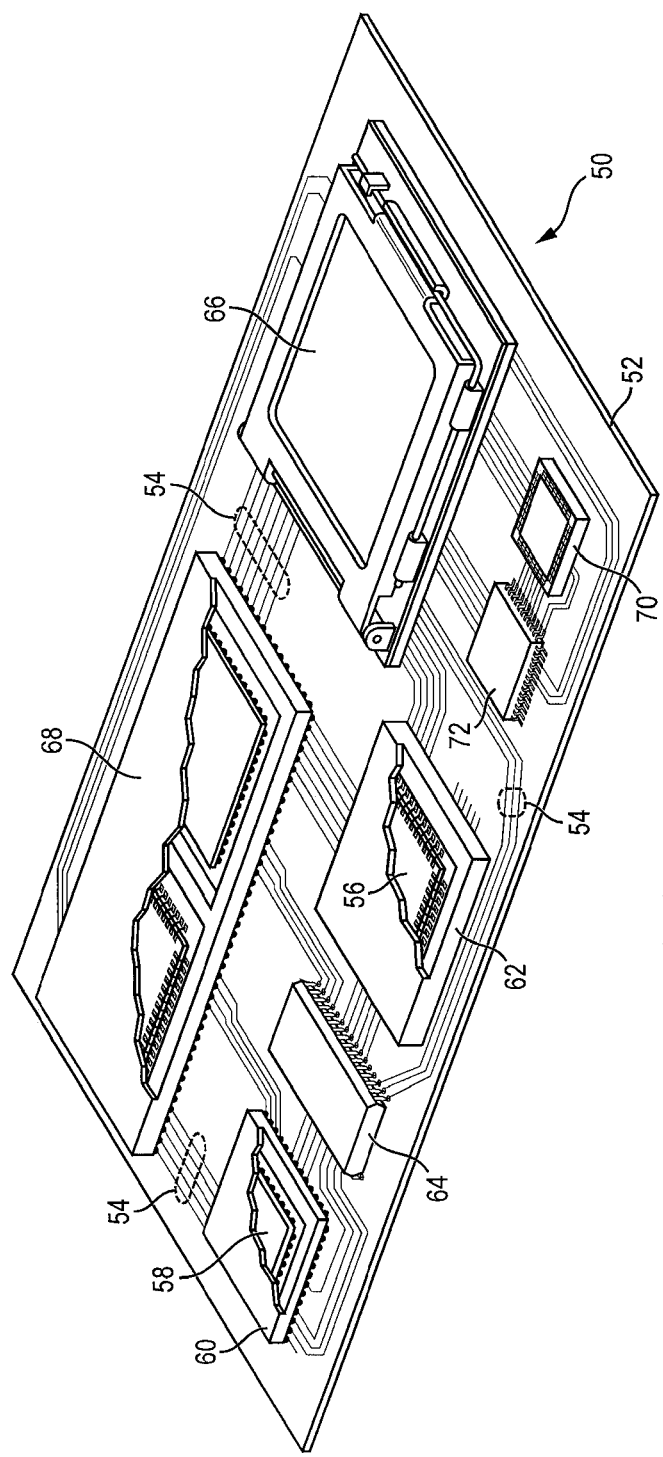
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

The process of changing the structure and properties of the photoresist occurs as either negative-acting photoresist or positive-acting photoresist. In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
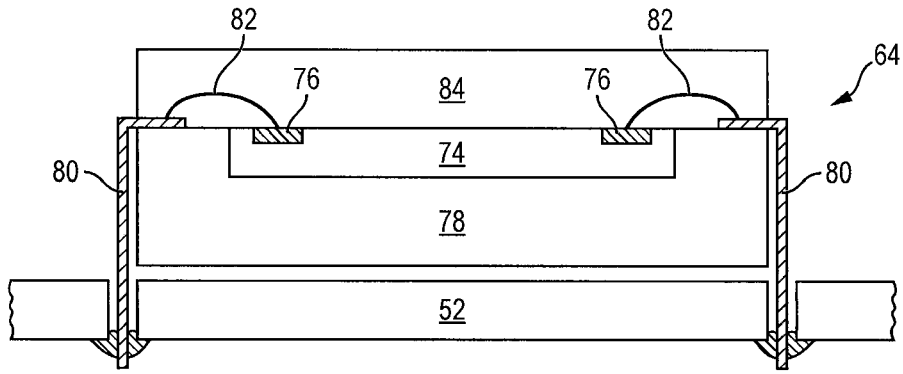
FIGS. 2a-2c illustrate further detail of the representative semiconductor packages mounted to the PCB.
Figure 2B:
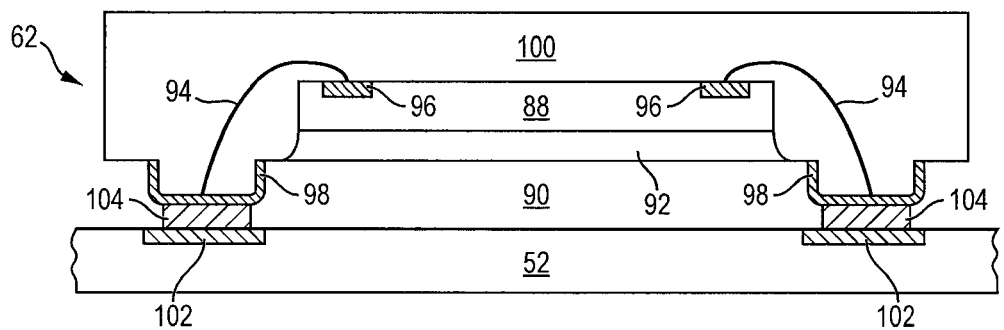
Figure 2C:
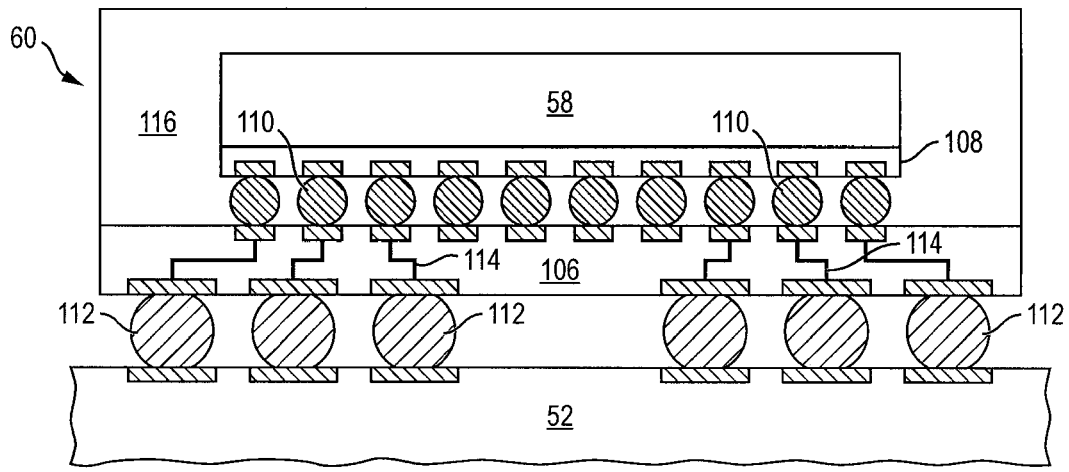

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
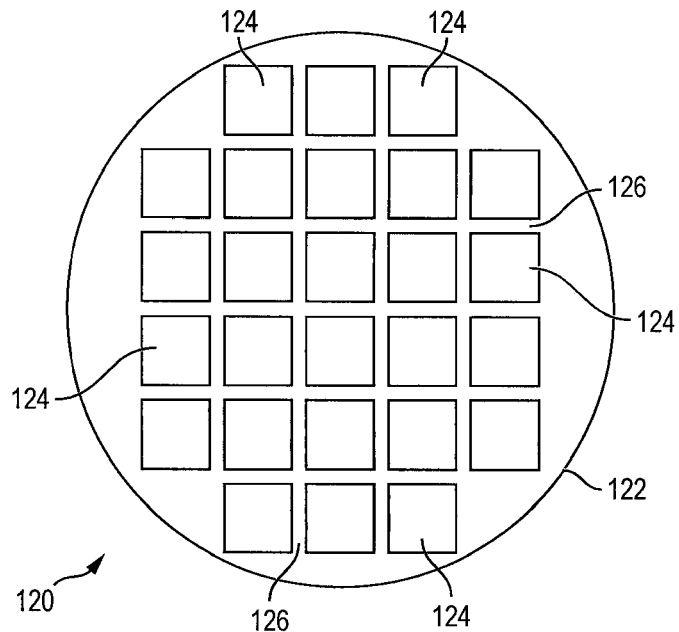
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
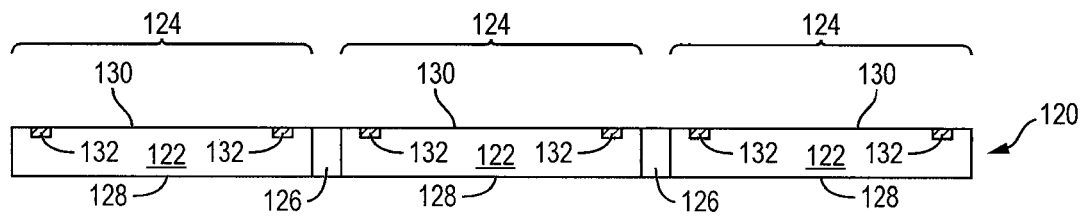

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
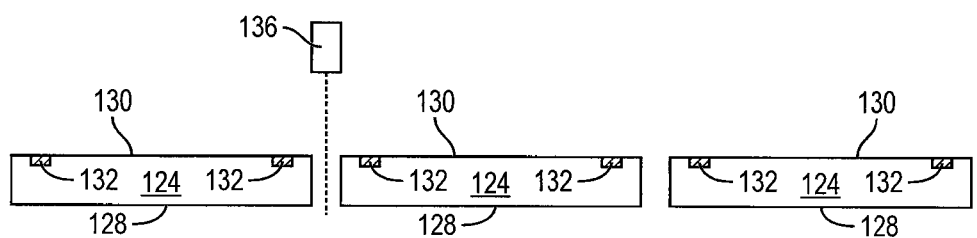

In FIG. 3c, semiconductor wafer 120 is singulated through saw street 126 using a saw blade or laser cutting tool 136 into individual semiconductor die 124.

Figure 4A:
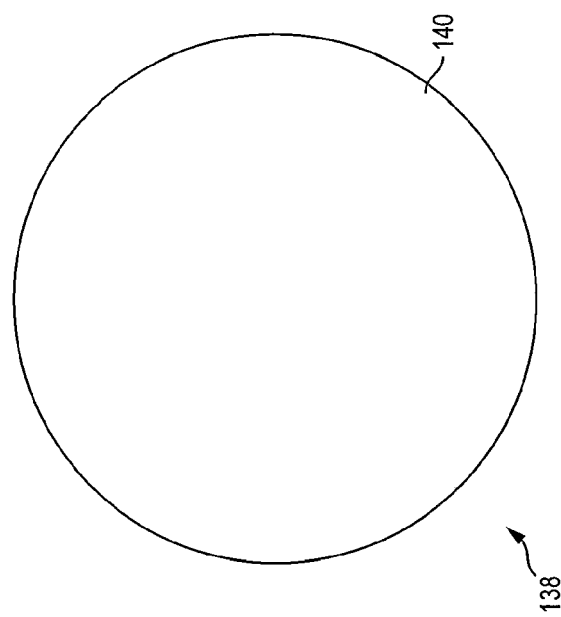
FIGS. 4a-4p illustrate a method of using a carrier to form a stackable package having conductive posts for vertical interconnect.

FIGS. 4a-4p illustrate, in relation to FIGS. 1 and 2a-2c, a process of using a copper carrier to form a reconfigured stackable wafer level package with conductive posts. FIG. 4a shows a top plan view of a copper base carrier or wafer 138 including base material 140, such as copper, copper alloys (including one or more elements of nickel, iron, zinc, tin, chromium, silver, and phosphorous), or other suitable material for structural support and subsequent via formation. A stiffness of copper carrier 138 reduces warpage and related handling issues that result from carriers with less stiffness. In one embodiment, carrier 138 is a 30.48 centimeter (cm) diameter copper carrier.

Figure 4B:
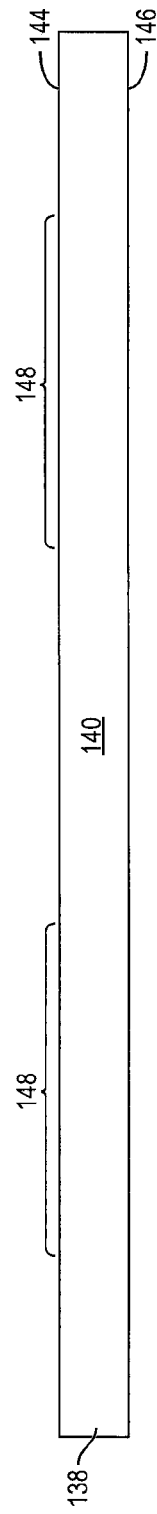

FIG. 4b shows a cross-sectional view of a portion of copper carrier 138. Copper carrier 138 has a first surface 144 and a second surface 146 opposite the first surface. Copper carrier 138 also includes a plurality of semiconductor die mounting areas 148 that have areas of sufficient size to receive later mounted semiconductor die.

Figure 4C:
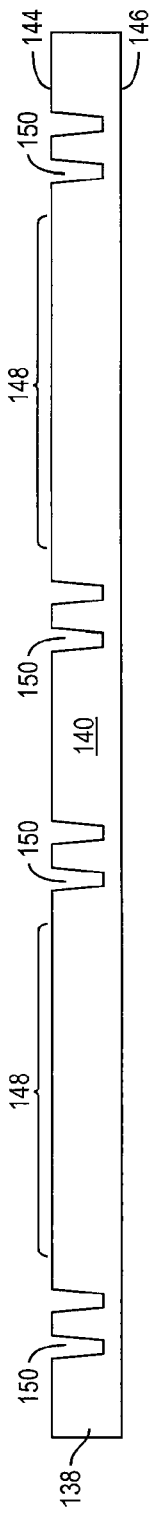

In FIG. 4c, a plurality of vias or openings 150 are formed in copper carrier 138. Vias 150 are formed through first surface 144 and extend partially but not completely through copper carrier 138 using laser drilling, mechanical drilling, or deep reactive ion etching (DRIE). Vias 150 are formed in a periphery of the semiconductor die mounting areas 148 and are positioned for subsequent electrical interconnect with later mounted semiconductor die.

Figure 4D:
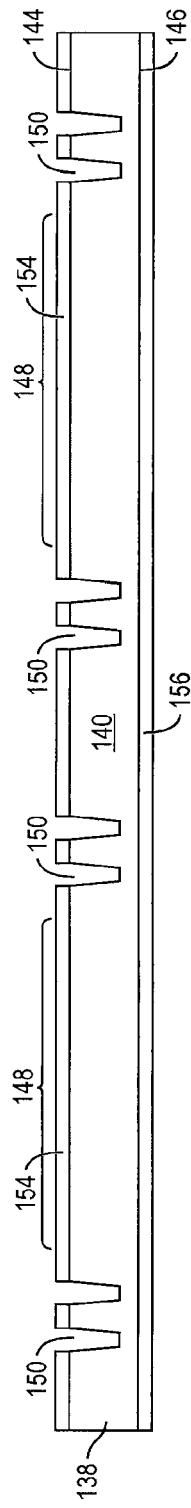

In FIG. 4d, masking layer 154 is formed over first surface 144 of copper carrier 138, and openings in the masking layer are formed over openings 150. A masking layer 156 is formed over second surface 146 of copper carrier 138. In one embodiment, masking layers 154 and 156 are dry film resist (DFR) layers of uniform thickness applied over copper carrier 138 by lamination.

Figure 4E:
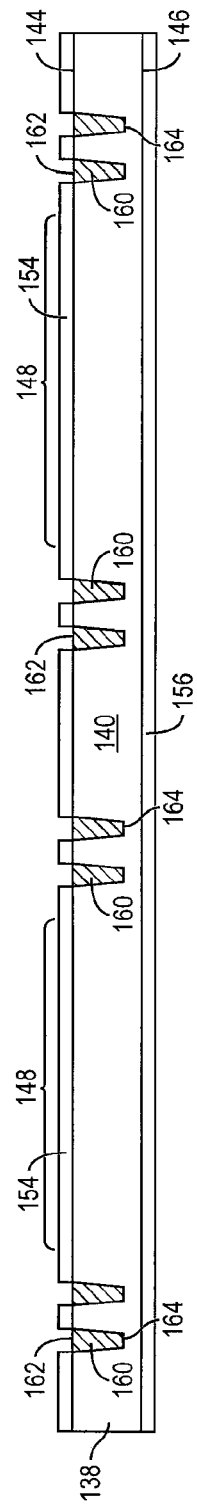

In FIG. 4e, vias 150 are filled with Al, Cu, Sn, Ni, Au, Ag, titanium (Ti), tungsten (W), poly-silicon, conductive paste, high temperature solder material, or other suitable electrically conductive material using PVD, CVD, electrolytic plating, electroless plating process, or other suitable metal deposition process to form conductive posts, pillars, or vias 160. In one embodiment, conductive posts 160 are Ni formed by electrolytic plating. By forming conductive posts 160 in copper carrier 138, a diameter of the conductive posts can be made larger than vias formed by a laser in a conventional molded package or TSV process for a reduced cost. Forming conductive posts 160 without excessive cost and with the larger diameter provides a cost effective method for manufacturing conductive posts that can also function as package level input/output (I/O) interconnects.

Conductive posts 160 include a first surface 162 and a second surface 164 opposite the first surface. First surface 162 is substantially coplanar with first surface 144 of copper carrier 138, and second surface 164 is disposed between first surface 144 and second surface 146 of copper carrier 138. First surface 162 and second surface 164 of conductive posts 160 are planar and provide for subsequent z-direction electrical interconnect for a reconfigured stackable wafer level package.

Figure 4F:
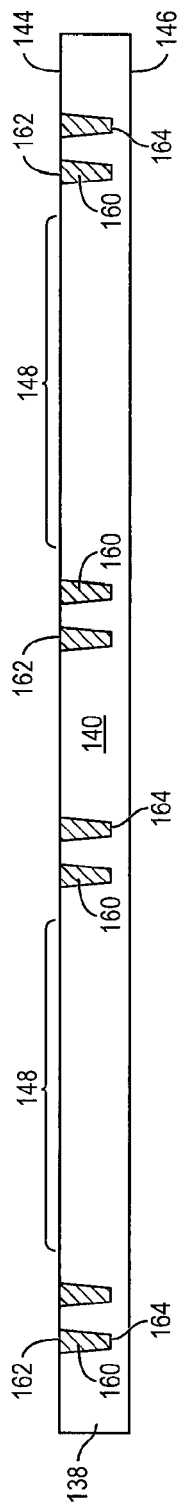

In FIG. 4f, masking layers 154 and 156 are removed from over first surface 144 and second surface 146 of copper carrier 138, respectively, after the formation of conductive posts 160. The removal of masking layers 154 and 156 expose first surface 144 and second surface 146 of copper carrier 138.

Figure 4G:
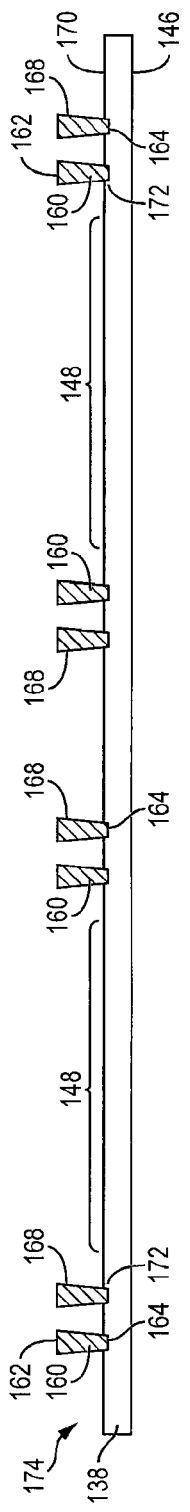

In FIG. 4g, a first portion of copper carrier 138 is removed. In one embodiment, the first portion of copper carrier 138 is removed isotropically by an alkali etchant using a pressurized spray etching. The removal of the first portion of copper carrier 138 exposes sidewalls 168 of conductive posts 160. Sidewalls 168 extend from first surface 162 to second surface 164 of conductive posts 160. Sidewalls 168 are angled or tapered. Alternatively, sidewalls 168 can be parallel with respect to each other and orthogonal with respect to first and second surfaces 162 and 164. The first portion of copper carrier 138 extends from first surface 144 partially but not completely through copper carrier 138. In addition to exposing sidewalls 168, the removal of the first portion of copper carrier 138 exposes a third surface 170 of carrier 138 that is between first surface 162 and second surface 164 of conductive post 160. Third surface 170 is parallel with respect to first and second surfaces 144 and 146 of copper carrier 138.

A base portion 172 of conductive posts 160 remains attached to, and surrounded by, copper carrier 138 after the removal of the first portion of the copper carrier between first surface 144 and third surface 170 of carrier 138. Removal of copper carrier 138 between first surface 144 and third surface 170 by the alkali etchant occurs progressively and is controlled to not remove material, e.g. nickel, from conductive posts 160. The amount of copper removed from copper carrier 138 in the etch process is controlled through belt speed, etch solution spray pressure, etch solution temperature, etch solution concentration, and etch solution pH. The controlled removal of the first portion of copper carrier 138 between first surface 144 and third surface 170 prevents over-etching and ensures that the interface between base 172 and copper carrier 138 remains secure, and does not loosen or increase a risk of premature separation between conductive posts 160 and the copper carrier. The controlled removal of the first portion of copper carrier 138 is similar to copper etching technology in the controlled removal of material during a quad flat no-lead strip etch process (QFNs-st) and a quad flat no-lead sawn strip etch (QFNs-se). Exposing third surface 170 of copper carrier 138 results in a carrier 174 having conductive posts 160 with exposed sidewalls 168 and base portions 172 embedded in copper carrier 138.

While the steps shown in FIGS. 4a-4g of forming carrier 174 can be performed in conjunction with the packaging of semiconductor die, alternatively, carrier 174 can be supplied as a pre-fabricated unit made at a leadframe manufacturing factory. Outsourcing the steps shown in FIGS. 4a-4g can improve quality, reduce production cycle-time, increase capacity, and reduce overall cost with respect to semiconductor die packaging. Furthermore, the formation of conductive posts 160 within vias 150 formed in copper carrier 138 is a simple, stable, and cost-effective method for forming z-direction electrical interconnect within a reconfigured stackable wafer level package. Formation of vias with the use of lasers in silicon or in a molded reconfigured package body, together with the filling or plating of the laser formed vias, increases cost and cycle-time with respect to the method shown in FIGS. 4a-4g. Use of the method shown in FIGS. 4a-4g, especially with vias having large diameters that are entirely filled with conductive material, yield increased savings with respect to cost and cycle-time.

Figure 4H:
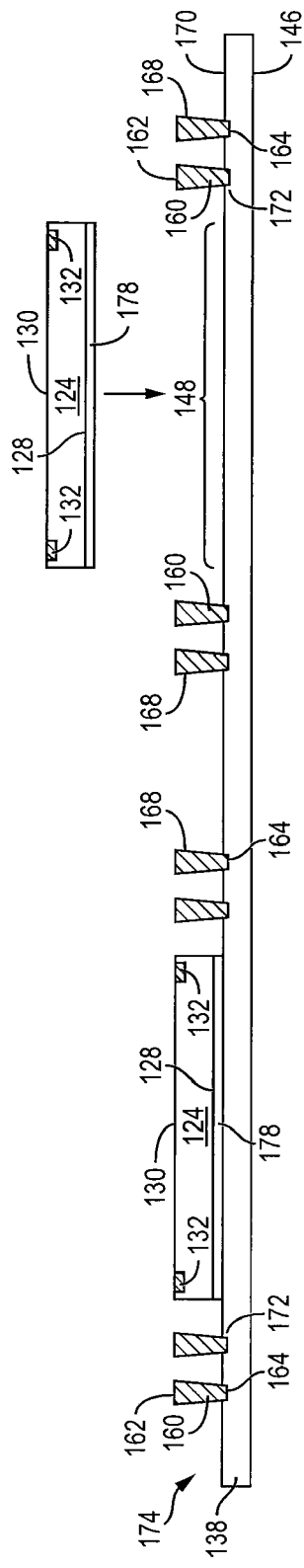

In FIG. 4h, semiconductor die 124 from FIGS. 3a-3c are positioned over semiconductor die mounting areas 148 with back surfaces 128 oriented toward copper carrier 138. FIG. 4h further shows semiconductor die 124 are mounted to semiconductor die mounting area 148, with die attach adhesive 178, and are disposed between exposed sidewalls 168 of conductive posts 160 as part of a reconstituted or reconfigured wafer level package. Adhesive 178 includes a die attach adhesive, epoxy, or other adhesive material.

Figure 4I:
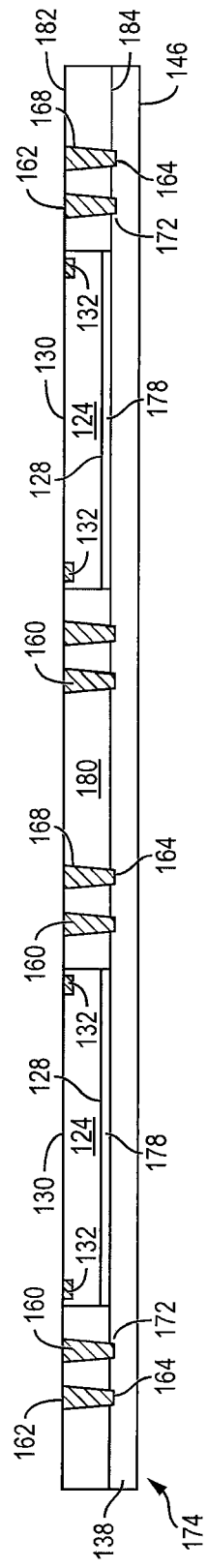

In FIG. 4i, an encapsulant or molding compound 180 is deposited over copper carrier 138, around semiconductor die 124, and around conductive posts 160 using a paste printing, compressive molding, transfer molding, liquid encapsulant molding, vacuum lamination, spin coating, or other suitable applicator. Encapsulant 180 can be polymer composite material, such as epoxy resin with filler, epoxy acrylate with filler, or polymer with proper filler. The viscosity of encapsulant 180 is selected for uniform coverage, e.g., a lower viscosity increases the flow of the encapsulant. Encapsulant 180 is non-conductive and environmentally protects semiconductor die 124 from external elements and contaminants. First surface 162 of conductive posts 160 and active surface 130 of semiconductor die 124 are substantially coplanar with first surface 182 of encapsulant 180. A second surface 184 of encapsulant 180 is formed opposite first surface 182 of the encapsulant and contacts third surface 170 of copper carrier 138.

Figure 4J:
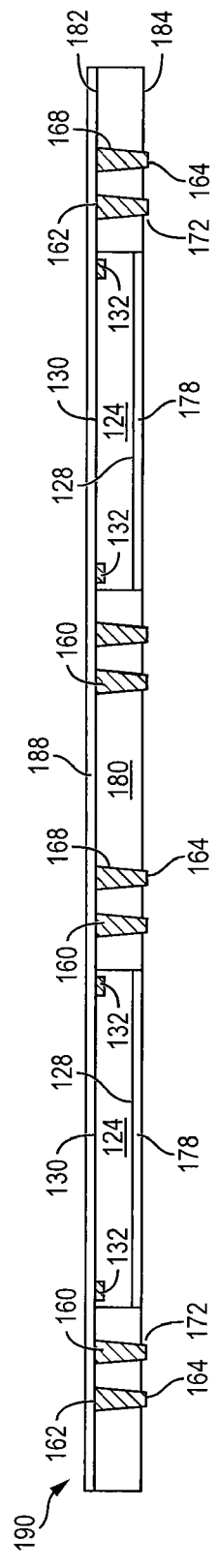

In FIG. 4j, an optional masking or temporary taping layer 188 is formed over first surface 182 of encapsulant 180, over first surface 162 of conductive posts 160, and over active surface 130 of semiconductor die 124. Masking layer 188 protects active surface 130 of semiconductor die 124 during the removal of the remaining portion of copper carrier 138 that extends between second and third surfaces 146 and 170 of copper carrier 138. In one embodiment, the remaining portion of copper carrier 138 is removed isotropically by an alkali etchant using a pressurized spray etching. The removal of the remaining portion of copper carrier 138 exposes bases 172 of conductive posts 160, and further exposes second surface 184 of encapsulant 180. After the removal of the remaining portion of copper carrier 138, masking layer 188 is also removed. A reconstituted wafer 190, comprising semiconductor die 124, encapsulant 180, and conductive posts 160 remains. Bases 172 of conductive posts 160 protrude from, and are not coplanar with, second surface 184 of encapsulant 180.

Figure 4K:
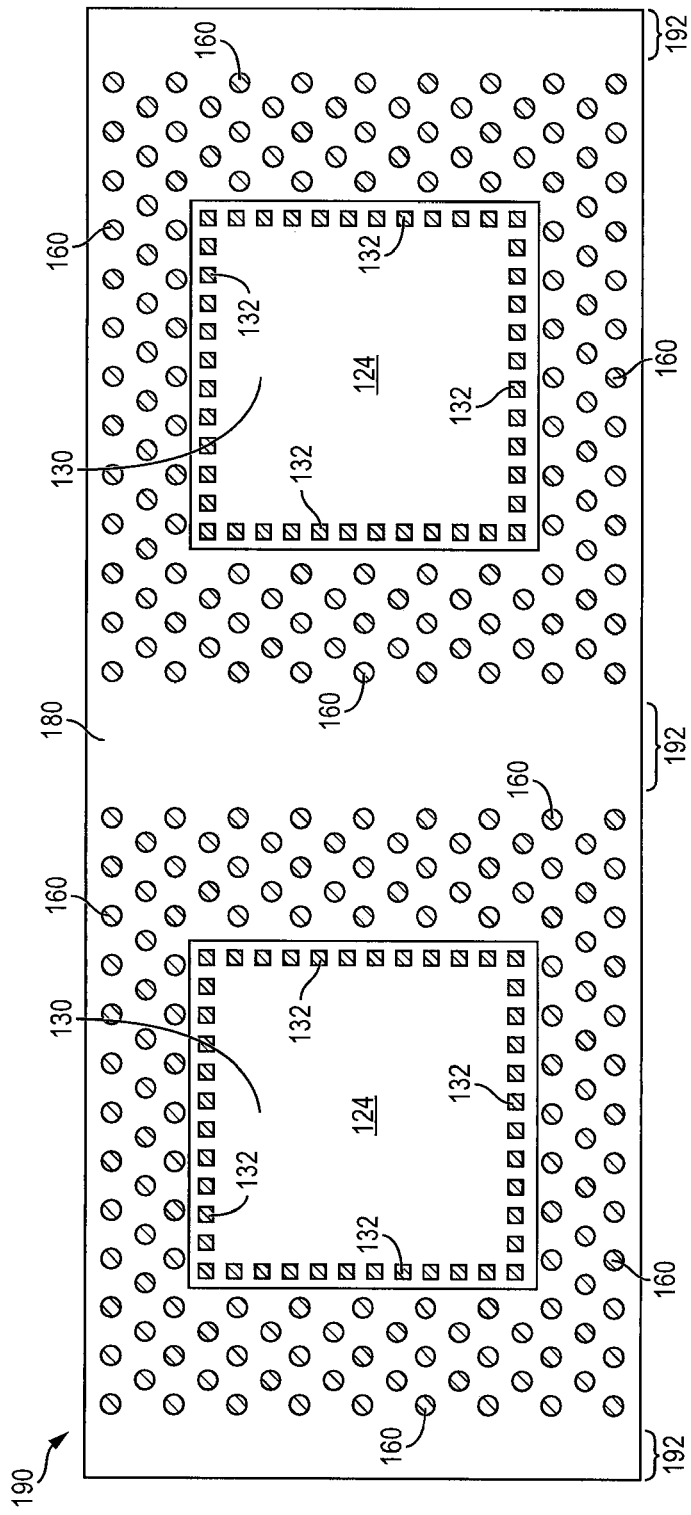

In FIG. 4k, a top or plan view of the portion of the reconstituted wafer 190 shown in FIG. 4j is presented. Active surface 130 of semiconductor die 124 including a plurality of contact pads 132 are shown surrounded by encapsulant 180 and conductive posts 160. Conductive posts 160 are formed in a periphery of semiconductor die 124 and provide electrical z-direction interconnect within reconstituted wafer 190 by extending between first surface 182 and second surface 184 of encapsulant 180. Saw streets 192 extend through encapsulant 180, and are formed outside a footprint of the periphery of semiconductor die 124 occupied by conductive posts 160.

By using only conductive posts 160 for electrical interconnect between contact pads 132 and second surface 184 of encapsulant 180, the number of electrical connections is limited with respect to embodiments including interconnects having finer pitch or applications using additional vertical interconnects such as bond wires. However, for applications requiring a number of vertical interconnects that are compatible with the available number of conductive posts 160 in reconstituted wafer 190, larger less expensive z-directional vertical interconnects are available by forming conductive posts 160 in copper carrier 138 as described. Common devices, such as QFNs-st, have a number of I/O connections that are compatible with the number of conductive posts 160 in reconstituted wafer 190. For example, MT6253 a QFNs-st with an area of 11.5 millimeters (mm)×11.5 mm includes 261 leads at 0.4 mm lead pitch, in which many of the leads are depopulated. Accordingly, MT6253 and other similar devices that do not include an excessive number of I/Os are compatible with the number of z-directional interconnects provided by conductive posts 160 within reconstituted wafer 190.

Figure 4L:
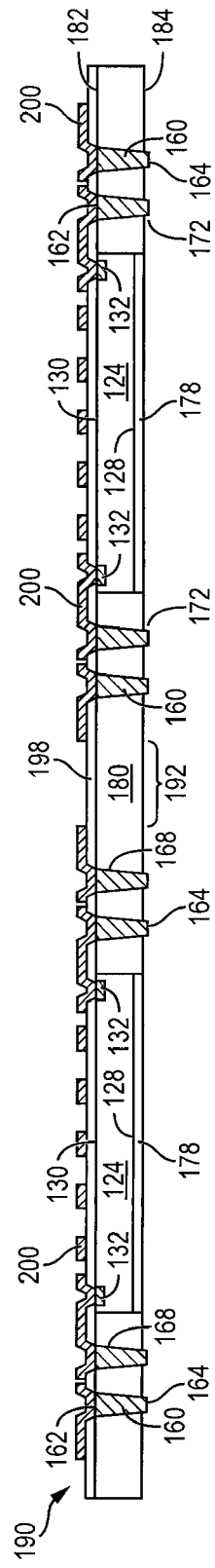

In FIG. 4l, an insulating or passivation layer 198 is formed over first surface 182 of encapsulant 180, over first surface 162 of conductive post 160, and over active surface 130 of semiconductor die 124 using PVD, CVD, printing, spin coating, spray coating, sintering or thermal oxidation. The insulating layer 198 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 198 is removed by an etching process to expose contact pads 132 and first surface 162 of conductive posts 160.

An electrically conductive layer or RDL 200 is formed over, and follows the contours of, insulating layer 198. Conductive layer 200 is further formed over both exposed contact pads 132 and the exposed first surfaces 162 of conductive posts 160 using a patterning and metal deposition process such as printing, PVD, CVD, sputtering, electrolytic plating, and electroless plating. Conductive layer 200 can be one or more layers of Al, Cu, Sn, Ni, Au, Ag, or other suitable electrically conductive material. Conductive layer 200 is electrically connected to contact pads 132 and conductive posts 160 according to the design and function of semiconductor die 124.

Figure 4M:
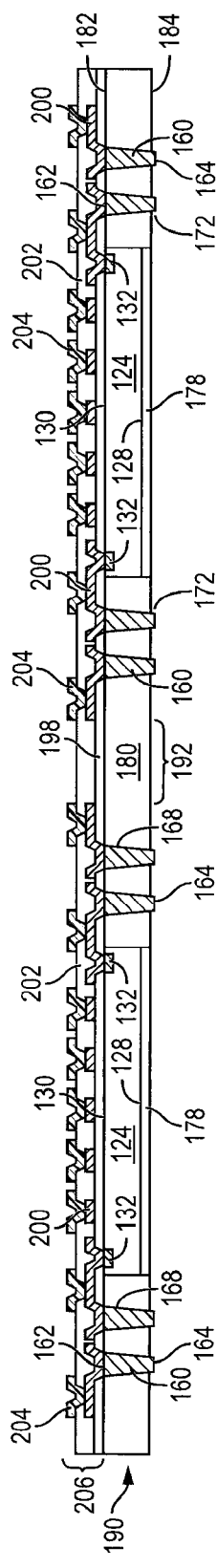

In FIG. 4m, an insulating or passivation layer 202 is formed over and follows the contours of insulating layer 198 and conductive layer 200 using PVD, CVD, printing, spin coating, spray coating, sintering or thermal oxidation. The insulating layer 202 contains one or more layers of SiO2, Si3N4, SiON, Ta2O5, Al2O3, or other material having similar insulating and structural properties. A portion of insulating layer 202 is removed by an etching process to expose conductive layer 200.

An electrically conductive layer or RDL 204 is formed over, and follows the contours of, insulating layer 202. Conductive layer 204 is further formed over exposed conductive layer 200 using a patterning and metal deposition process such as printing, PVD, CVD, sputtering, electrolytic plating, and electroless plating. Conductive layer 204 can be one or more layers of Al, Cu, Sn, Ni, Au, Ag, or other suitable electrically conductive material. Conductive layer 204 is electrically connected to conductive layer 200 for the routing of electrical signals vertically and laterally across reconstituted wafer 190 according to the design and function of semiconductor die 124. The combination of conductive layers 200 and 204, and insulating layers 198 and 202 constitute a build-up interconnect structure 206.

Figure 4N:
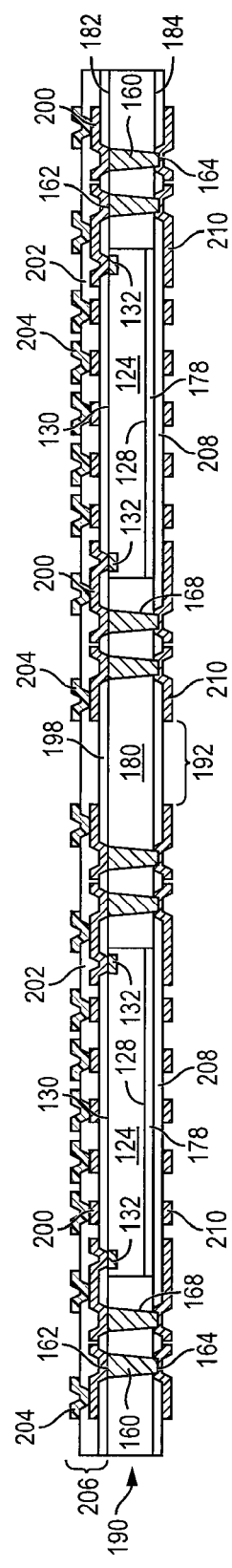

In FIG. 4n, an insulating or passivation layer 208 is formed over second surface 184 of encapsulant 180, over second surface 164 of conductive post 160, and over back surface 128 of semiconductor die 124 or die attach adhesive 178 using PVD, CVD, printing, spin coating, spray coating, sintering or thermal oxidation. The insulating layer 208 contains one or more layers of SiO2, Si3N4, SiON, Ta2O5, Al2O3, or other material having similar insulating and structural properties. A portion of insulating layer 208 is removed by an etching process to expose second surface 164 of conductive posts 160.

An electrically conductive layer or RDL 210 is formed over, and follows the contours of, insulating layer 208. Conductive layer 210 is further formed over exposed second surface 164 of conductive posts 160 using a patterning and metal deposition process such as printing, PVD, CVD, sputtering, electrolytic plating, and electroless plating. Conductive layer 210 can be one or more layers of Al, Cu, Sn, Ni, Au, Ag, or other suitable electrically conductive material. Conductive layer 210 is electrically connected to conductive posts 160 according to the design and function of semiconductor die 124.

Figure 4O:
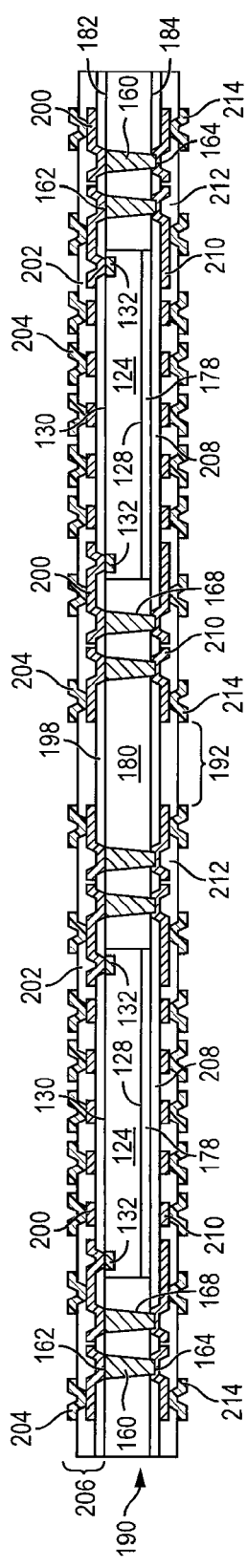

In FIG. 4o, an insulating or passivation layer 212 is formed over and follows the contours of insulating layer 208 and conductive layer 210 using PVD, CVD, printing, spin coating, spray coating, sintering or thermal oxidation. The insulating layer 212 contains one or more layers of SiO2, Si3N4, SiON, Ta2O5, Al2O3, or other material having similar insulating and structural properties. A portion of insulating layer 212 is removed by an etching process to expose conductive layer 210.

An electrically conductive layer or RDL 214 is formed over, and follows the contours of, insulating layer 212. Conductive layer 214 is further formed over exposed conductive layer 210 using a patterning and metal deposition process such as printing, PVD, CVD, sputtering, electrolytic plating, and electroless plating. Conductive layer 214 can be one or more layers of Al, Cu, Sn, Ni, Au, Ag, or other suitable electrically conductive material. Conductive layer 214 is electrically connected to conductive layer 210 for the routing of electrical signals vertically and laterally across reconstituted wafer 190 according to the design and function of semiconductor die 124.

Because warpage is expected throughout the process of wafer integration, and particularly during formation of RDLs and corresponding insulating layers, a thickness of semiconductor die 124, encapsulant 180, conductive posts 160, conductive layers 200, 204, 210, and 214, insulating layers 198, 202, 208, 212, and a thickness of subsequently formed bumps are calibrated to reduce warpage of the reconstituted or reconfigured wafer level package. Furthermore, the use of copper carrier 138 can stiffen the reconfigured wafer during formation to alleviate handling issues that may create additional warpage of the reconfigured wafer.

In FIG. 4p, an electrically conductive bump material is deposited over conductive layer 214 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 214 using a suitable attachment or bonding process. In one embodiment, the bump material is reflowed by heating the material above its melting point to form balls or bumps 218. In some applications, bumps 218 are reflowed a second time to improve electrical contact to conductive layer 214. An under bump metallization (UBM) layer can be formed under bumps 218. Bumps 218 can also be compression bonded to conductive layer 214. Bumps 218 represent one type of interconnect structure that can be formed over conductive layer 214. The interconnect structure can also be stud bumps, micro bumps, or other electrical interconnect. The combination of conductive layers 210 and 214, insulating layers 208 and 212, and bumps 218 constitute a build-up interconnect structure 220.

FIG. 4p further shows reconstituted wafer 190 is singulated through saw street 192 and build-up interconnect structures 206 and 220 with saw blade or laser cutting tool 222 to form individual stackable wafer level packages with conductive posts 224. Individual packages 224, including semiconductor die 124, are electrically connected to external devices through build-up interconnect structures 206 and 220.

Because warpage is expected throughout the process of wafer integration, thicknesses of RDLs, corresponding insulating layers, and bumps are formed with thicknesses calibrated to reduce warpage of the reconstituted wafer level package. Furthermore, use of copper carrier 138 stiffens the reconfigured wafer during formation to alleviate handling issues that can create additional warpage of the reconfigured wafer. Additionally, by forming conductive posts 160 in copper carrier 138, a diameter of the conductive posts can be made larger, and at a reduced cost, with respect to vias formed by a laser in a conventional molded package or TSV process. Forming conductive posts 160 without excessive cost and with the larger diameter provides a cost effective method for manufacturing conductive posts. In one embodiment, copper carrier 138 is removed isotropically by an alkali etchant using a pressurized spray etching. The controlled removal of copper carrier 138 prevents over-etching and ensures that the interface between base 172 of conductive post 160 and copper carrier 138 remains secure and does not loosen or increase a risk of premature separation between the conductive posts and the copper carrier. During removal of copper carrier 138, an optional masking or temporary taping layer 188 is formed over and protects active surface 130 of semiconductor die 124.

The formation of conductive posts 160 by filling vias 150 in copper carrier 138 with conductive material is a simple, stable, and cost-effective method for forming z-direction electrical interconnects within a reconfigured stackable wafer level package. Formation of vias with the use of lasers in silicon or in a molded reconfigured package body, together with the filling or plating of the laser formed vias, increases cost and cycle-time with respect to the method shown in FIGS. 4a-4g. Use of the method shown in FIGS. 4a-4g, especially with vias having large diameters that are entirely filled with conductive material, yield increased savings with respect to cost and cycle-time. Furthermore, the formation of carrier 174, as shown in FIGS. 4a-4g, can be supplied as a pre-fabricated unit made at a leadframe manufacturing factory. Outsourcing the formation of carrier 174 can improve quality, reduce production cycle-time, increase capacity, and reduce overall cost with respect to semiconductor die packaging.

Continuing from FIG. 4p, FIG. 5 shows a number of individual stackable wafer level packages with conductive posts 224 mounted one above the other to form a PoP configuration 228. PoP 228 is formed by mounting singulated individual packages 224 one above the other. Alternatively, PoP 228 is formed by mounting packages 224 one above the other at the reconstituted wafer level before singulation. Singulation then occurs to form multiple PoPs 228.

Figure 6E:
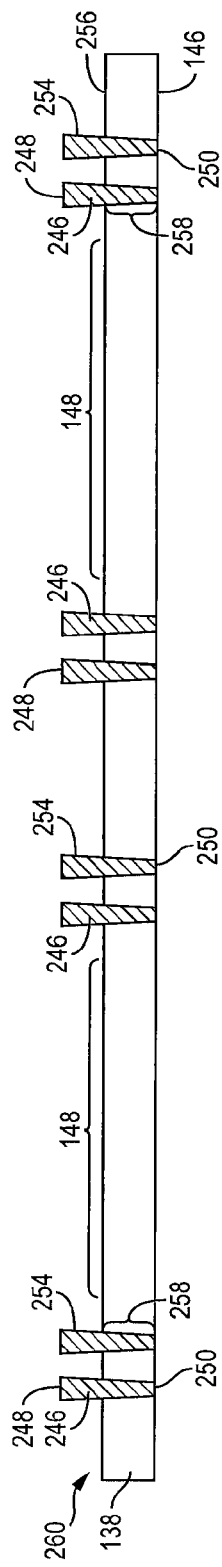
FIGS. 6a-6o illustrate a method of using a carrier to form a package having multiple semiconductor die and conductive posts.
Figure 6F:
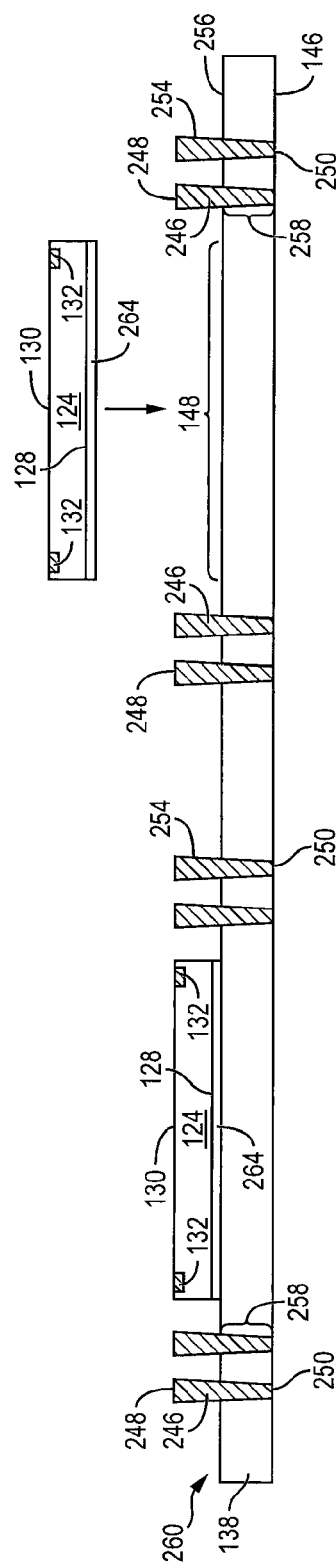
Figure 6G:
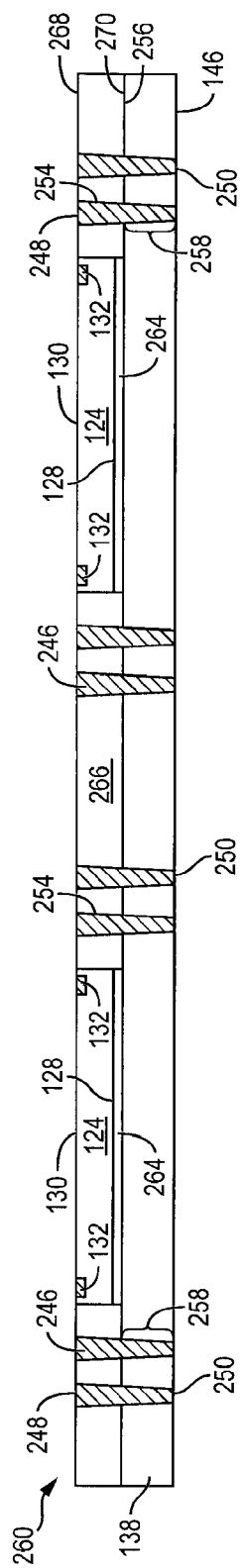
Figure 6N:
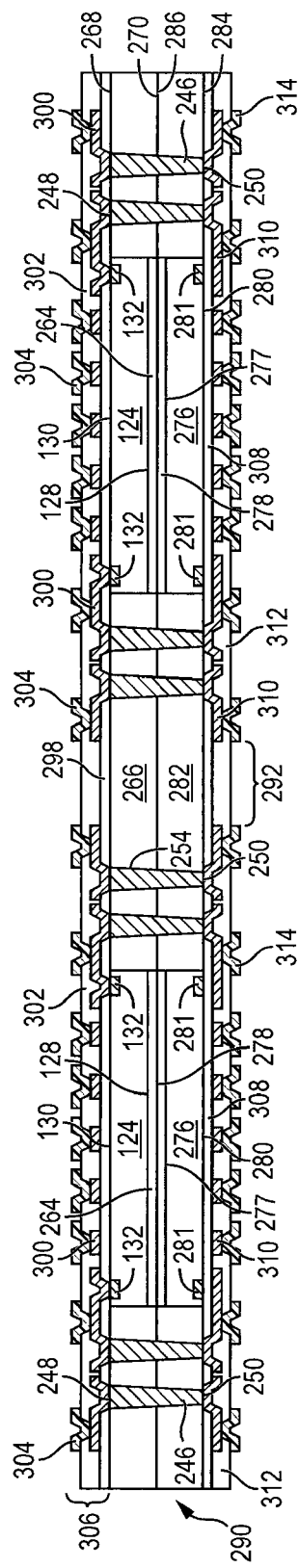
Figure 6O:
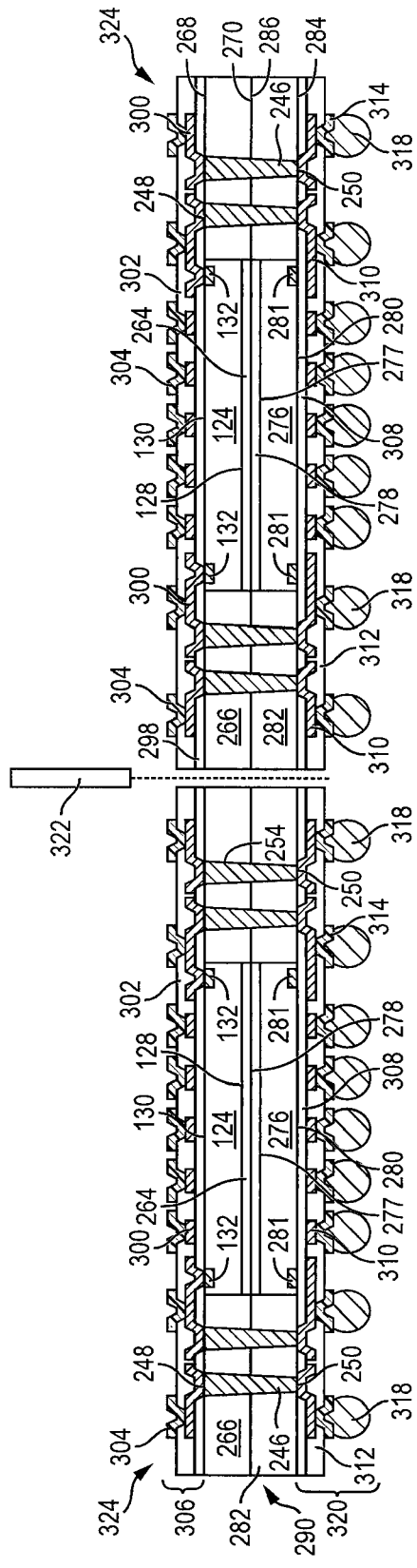

FIGS. 6a-6o illustrate another process of using a copper carrier to form a reconfigured stackable wafer level package with conductive posts. Continuing from FIG. 4a, FIG. 6a shows a plurality of vias or openings 236 are formed completely through copper carrier 138. Vias 236 are formed through both first and second surfaces 144 and 146 of copper carrier 138 using laser drilling, mechanical drilling, or DRIE. Vias 236 are formed in a periphery of semiconductor die mounting areas 148 and are positioned for subsequent electrical interconnect with later mounted semiconductor die.

In FIG. 6b, masking layer 240 is formed over first surface 144 of copper carrier 138 and openings in the masking layer are formed over openings 236. Similarly, masking layer 242 is formed over second surface 146 of copper carrier 138; however, masking layer 242 covers, and is formed over, openings 236. Masking layer 242, unlike masking layer 240, does not include openings formed in the masking layer over openings 236. In one embodiment, masking layers 240 and 242 are DFR layers of uniform thickness applied over copper carrier 138 by lamination.

In FIG. 6c, vias 236 are filled with Al, Cu, Sn, Ni, Au, Ag, Ti, W, poly-silicon, conductive paste, high temperature solder material, or other suitable electrically conductive material using PVD, CVD, electrolytic plating, electroless plating process, or other suitable metal deposition process to form conductive posts, pillars, or vias 246. In one embodiment, conductive posts 246 are Ni formed by electrolytic plating. By forming conductive posts 246 in copper carrier 138, a diameter of the conductive posts can be made larger than vias formed by a conventional molded package or TSV process for a reduced cost. Forming conductive posts 246 without excessive cost, and with the larger diameter, provides a cost effective method for manufacturing conductive posts that can also function as package level I/O interconnects.

Conductive posts 246 include a first surface 248 and a second surface 250 opposite the first surface. First surface 248 is substantially coplanar with first surface 144 of copper carrier 138 and second surface 250 is substantially coplanar with second surface 146 of copper carrier 138. First and second surfaces 248 and 250 of conductive posts 246 are planar and provide for subsequent z-direction electrical interconnect for a reconfigured stackable wafer level package.

In FIG. 6d, masking layers 240 and 242 are removed from over first surface 144 and second surface 146 of copper carrier 138, respectively, after the formation of conductive posts 246. The removal of masking layers 240 and 242 exposes first surface 144 and second surface 146 of copper carrier 138.

In FIG. 6e, a first portion of copper carrier 138 is removed. In one embodiment, the first portion of copper carrier 138 is removed isotropically by an alkali etchant using a pressurized spray etching. The removal of the first portion of copper carrier 138 exposes sidewalls 254 of conductive posts 246. Sidewalls 254 extend from first surface 248 to second surface 250 of conductive posts 246. Sidewalls 254 are angled or tapered. Alternatively, sidewalls 254 can be parallel with respect to each other and orthogonal with respect to first and second surfaces 248 and 250 of conductive posts 246. The first portion of copper carrier 138 extends from first surface 144 partially but not completely through copper carrier 138. In addition to exposing sidewalls 254, the removal of the first portion of copper carrier 138 exposes a third surface 256 of carrier 138 that is between first surface 248 and second surface 250 of conductive post 246. In one embodiment, third surface 256 is halfway between or equidistant with respect to first surface 248 and second surface 250 of conductive post 246. Third surface 256 is parallel with respect to first and second surfaces 144 and 146 of copper carrier 138.

A base portion 258 of conductive posts 246 remains attached to, and surrounded by, copper carrier 138 after the removal of the first portion of the copper carrier because third surface 256 of carrier 138 is between first surface 248 and second surface 250 of conductive post 246. Removal of copper carrier 138 between first surface 144 and third surface 256 by the alkali etchant occurs progressively and is controlled to not remove material, e.g. nickel, from conductive posts 246. The amount of copper removed from copper carrier 138 in the etch process is controlled through belt speed, etch solution spray pressure, etch solution temperature, etch solution concentration, and etch solution pH. The controlled removal of the first portion of copper carrier 138 between first surface 144 and third surface 256 prevents over-etching and ensures that the interface between base 258 and copper carrier 138 remains secure, and does not loosen or increase a risk of premature separation between conductive posts 246 and the copper carrier. The controlled removal of the first portion of copper carrier 138 is similar to copper etching technology in the controlled removal of material for QFNs-st and QFNs-se. Exposing third surface 256 results in a carrier 260 having conductive posts 246 with exposed sidewalls 254 and base portions 258 embedded in copper carrier 138.

While the steps shown in FIGS. 6a-6e of forming carrier 260 can be performed in conjunction with the packaging of semiconductor die, alternatively, carrier 260 can be supplied as a pre-fabricated unit made at a leadframe manufacturing factory. Outsourcing the steps shown in FIGS. 6a-6e can improve quality, reduce production cycle-time, increase capacity, and reduce overall cost with respect to semiconductor die packaging. Furthermore, the formation of conductive posts 246 within copper carrier 138 is a simple, stable, and cost-effective method for forming z-direction electrical interconnect within a reconfigured stackable wafer level package. Formation of vias with the use of lasers in silicon or in a molded reconfigured package body, together with the filling or plating of the laser formed vias, increases cost and cycle-time with respect to the method shown in FIGS. 6a-6e. Use of the method shown in FIGS. 6a-6e, especially with vias having large diameters that are entirely filled with conductive material, yields increased savings of cost and cycle-time.

In FIG. 6f, semiconductor die 124 from FIGS. 3a-3c are positioned over semiconductor die mounting areas 148 with back surfaces 128 oriented toward copper carrier 138. FIG. 6f further shows semiconductor die 124 mounted to semiconductor die mounting area 148, with die attach adhesive 264, and disposed between exposed sidewalls 254 of conductive posts 246, as part of a reconstituted or reconfigured wafer level package. Adhesive 264 includes a die attach adhesive, epoxy, or other adhesive material.

In FIG. 6g, a first encapsulant or molding compound 266 is deposited over copper carrier 138, around semiconductor die 124, and around conductive posts 246 using a paste printing, compressive molding, transfer molding, liquid encapsulant molding, vacuum lamination, spin coating, or other suitable applicator. First encapsulant 266 can be polymer composite material, such as epoxy resin with filler, epoxy acrylate with filler, or polymer with proper filler. The viscosity of first encapsulant 266 is selected for uniform coverage, e.g., a lower viscosity increases the flow of the first encapsulant. First encapsulant 266 is non-conductive and environmentally protects semiconductor die 124 from external elements and contaminants. First surface 248 of conductive posts 246 and active surface 130 of semiconductor die 124 are substantially coplanar with first surface 268 of first encapsulant 266. A second surface 270 of first encapsulant 266 is formed opposite first surface 268 of the first encapsulant and contacts third surface 256 of copper carrier 138.

In FIG. 6h, an optional masking or temporary taping layer 274 is formed over first surface 268 of first encapsulant 266, over first surface 248 of conductive posts 246, and over active surface 130 of semiconductor die 124. Masking layer 274 protects active surface 130 of semiconductor die 124 during the removal of the remaining portion of copper carrier 138 that extends between second and third surfaces 146 and 256 of copper carrier 138. In one embodiment, the remaining portion of copper carrier 138 is removed isotropically by an alkali etchant using a pressurized spray etching. The removal of the remaining portion of copper carrier 138 exposes bases 258 of conductive posts 246, and further exposes second surface 270 of first encapsulant 266. After the removal of the remaining portion of copper carrier 138, masking layer 274 is also removed. A reconstituted wafer 275, comprising semiconductor die 124, first encapsulant 266, and conductive posts 246 remains. Bases 258 of conductive posts 246 protrude from, and are not coplanar with, second surface 270 of first encapsulant 266.

In FIG. 6i, semiconductor die 276, similar to semiconductor die 124 from FIGS. 3a-3c, are positioned with back surfaces 277 and adhesive 278 aligned over and oriented towards back surface 128 of semiconductor die 124. Semiconductor die 276, similar to semiconductor die 124, include active surfaces 280 with contact pads 281 formed opposite back surface 277. FIG. 6i further shows semiconductor die 276 is mounted to semiconductor die 124 between conductive posts 246, with die attach adhesive 278 as part of a reconstituted or reconfigured wafer level package. Adhesive 278 includes a die attach adhesive, epoxy, or other adhesive material. To prevent a problem of semiconductor die 124 and 276 shifting with respect to each other during mounting and creating alignment problems for subsequent build-up interconnect layers including RDLs and insulating layers, adhesives 264 and 278 include backside coatings and laminates that eliminate movement and sliding of semiconductor die 124 and 276 with respect to each other during semiconductor die attachment.

In FIG. 6j, a second encapsulant or molding compound 282 is deposited over second surface 270 of first encapsulant 266, around semiconductor die 276, and around conductive posts 246. Second surface 250 of conductive posts 246 and active surface 280 of semiconductor die 276 are substantially coplanar with first surface 284 of second encapsulant 282. A second surface 286 of second encapsulant 282 is formed opposite first surface 284 of the second encapsulant and contacts second surface 270 of first encapsulant 266. Second encapsulant 282 is deposited using a paste printing, compressive molding, transfer molding, liquid encapsulant molding, vacuum lamination, spin coating, or other suitable applicator. Second encapsulant 282 can be polymer composite material, such as epoxy resin with filler, epoxy acrylate with filler, or polymer with proper filler. The viscosity and coefficient of thermal expansion (CTE) of second encapsulant 282 are selected for uniform coverage and to minimize flowability issues and warpage during in-mold cure. Temperature during the in-mold cure is controlled to prevent excess stress from developing in conductive posts 246 that would compromise integrity of the conductive posts. Temperature during the in-mold cure is further controlled to prevent excess stress among subsequently formed bumps. Additionally, first and second encapsulants 266 and 282 are selected to be compatible with each another. Second encapsulant 282, like first encapsulant 266, is non-conductive and environmentally protects semiconductor die 276 from external elements and contaminants. Conductive posts 246 are formed in a periphery of semiconductor die 124 and 276 and provide electrical z-direction interconnect within reconstituted wafer 290 by extending between first surface 268 of first encapsulant 266 and first surface 284 of second encapsulant 282. Saw streets 292 extend through first and second encapsulants 266 and 282, and are formed outside a footprint of the periphery of semiconductor die 124 and 276 occupied by conductive posts 246.

By using only conductive posts 246 for electrical interconnect between first surface 268 of first encapsulant 266 and first surface 284 of second encapsulant 282, the number of electrical connections is limited with respect to packages including interconnects having finer pitch or applications using additional vertical interconnects such as bond wires. However, for applications requiring a number of vertical interconnects that are compatible with the available number of conductive posts 246 in reconstituted wafer 290, larger less expensive z-directional vertical interconnects are available by forming conductive posts 246 in copper carrier 138 as described.

In FIG. 6k, an insulating or passivation layer 298 is formed over first surface 268 of first encapsulant 266, over first surface 248 of conductive post 246, and over active surface 130 of semiconductor die 124 using PVD, CVD, printing, spin coating, spray coating, sintering or thermal oxidation. The insulating layer 298 contains one or more layers of SiO2, Si3N4, SiON, Ta2O5, Al2O3, or other material having similar insulating and structural properties. A portion of insulating layer 298 is removed by an etching process to expose contact pads 132 and first surface 248 of conductive posts 246.

An electrically conductive layer or RDL 300 is formed over, and follows the contours of, insulating layer 298. Conductive layer 300 is further formed over both exposed contact pads 132 and exposed first surfaces 248 of conductive posts 246 using a patterning and metal deposition process such as printing, PVD, CVD, sputtering, electrolytic plating, and electroless plating. Conductive layer 300 can be one or more layers of Al, Cu, Sn, Ni, Au, Ag, or other suitable electrically conductive material. Conductive layer 300 is electrically connected to contact pads 132 and conductive posts 246 according to the design and function of semiconductor die 124 and 276.

In FIG. 6l, an insulating or passivation layer 302 is formed over and follows the contours of insulating layer 298 and conductive layer 300 using PVD, CVD, printing, spin coating, spray coating, sintering or thermal oxidation. The insulating layer 302 contains one or more layers of SiO2, Si3N4, SiON, Ta2O5, Al2O3, or other material having similar insulating and structural properties. A portion of insulating layer 302 is removed by an etching process to expose conductive layer 300.

An electrically conductive layer or RDL 304 is formed over, and follows the contours of, insulating layer 302. Conductive layer 304 is further formed over exposed conductive layer 300 using a patterning and metal deposition process such as printing, PVD, CVD, sputtering, electrolytic plating, and electroless plating. Conductive layer 304 can be one or more layers of Al, Cu, Sn, Ni, Au, Ag, or other suitable electrically conductive material. Conductive layer 304 is electrically connected to conductive layer 300 for the routing of electrical signals vertically and laterally across reconstituted wafer 290 according to the design and function of semiconductor die 124 and 276. The combination of conductive layers 300 and 304, and insulating layers 298 and 302 constitute build-up interconnect structure 306.

In FIG. 6m, an insulating or passivation layer 308 is formed over first surface 284 of second encapsulant 282, over second surface 250 of conductive post 246, and over active surface 280 of semiconductor die 276 using PVD, CVD, printing, spin coating, spray coating, sintering or thermal oxidation. The insulating layer 308 contains one or more layers of SiO2, Si3N4, SiON, Ta2O5, Al2O3, or other material having similar insulating and structural properties. A portion of insulating layer 308 is removed by an etching process to expose second surface 250 of conductive posts 246 and contact pads 281 of semiconductor die 276.

An electrically conductive layer or RDL 310 is formed over, and follows the contours of, insulating layer 308. Conductive layer 310 is further formed over exposed second surface 250 of conductive posts 246 and over contact pads 281 using a patterning and metal deposition process such as printing, PVD, CVD, sputtering, electrolytic plating, and electroless plating. Conductive layer 310 can be one or more layers of Al, Cu, Sn, Ni, Au, Ag, or other suitable electrically conductive material. Conductive layer 310 is electrically connected to conductive posts 246 according to the design and function of semiconductor die 124 and 276.

In FIG. 6n, an insulating or passivation layer 312 is formed over, and follows the contours of, insulating layer 308 and conductive layer 310 using PVD, CVD, printing, spin coating, spray coating, sintering or thermal oxidation. The insulating layer 312 contains one or more layers of SiO2, Si3N4, SiON, Ta2O5, Al2O3, or other material having similar insulating and structural properties. A portion of insulating layer 312 is removed by an etching process to expose conductive layer 310.

An electrically conductive layer or RDL 314 is formed over, and follows the contours of, insulating layer 312. Conductive layer 314 is further formed over exposed conductive layer 310 using a patterning and metal deposition process such as printing, PVD, CVD, sputtering, electrolytic plating, and electroless plating. Conductive layer 314 can be one or more layers of Al, Cu, Sn, Ni, Au, Ag, or other suitable electrically conductive material. Conductive layer 314 is electrically connected to conductive layer 310 for the routing of electrical signals vertically and laterally across reconstituted wafer 290 according to the design and function of semiconductor die 124 and 276.

Because warpage is expected throughout the process of wafer integration, and particularly during formation of RDLs and corresponding insulating layers, thicknesses of semiconductor die 124 and 276; first and second encapsulants 266 and 282; conductive posts 246; conductive layers 300, 304, 310, and 314; insulating layers 298, 302, 308, and 312; as well as a thickness of subsequently formed bumps, are all calibrated to reduce warpage of the reconstituted or reconfigured wafer level package. Furthermore, the use of copper carrier 138 can stiffen the reconfigured wafer during formation to alleviate handling issues that may create additional warpage of the reconfigured wafer.

In FIG. 6o, an electrically conductive bump material is deposited over conductive layer 314 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 314 using a suitable attachment or bonding process. In one embodiment, the bump material is reflowed by heating the material above its melting point to form balls or bumps 318. In some applications, bumps 318 are reflowed a second time to improve electrical contact to conductive layer 314. A UBM layer can be formed under bumps 318. Bumps 318 can also be compression bonded to conductive layer 314. Bumps 318 represent one type of interconnect structure that can be formed over conductive layer 314. The interconnect structure can also be stud bumps, micro bumps, or other electrical interconnect. The combination of conductive layers 310 and 314, insulating layers 308 and 312, and bumps 318 constitute a build-up interconnect structure 320.

FIG. 6o further shows reconstituted or reconfigured wafer 290 is singulated through saw street 292 and build-up interconnect structures 306 and 320 with saw blade or laser cutting tool 322 into individual stackable wafer level packages with conductive posts 324. Individual packages 324, including semiconductor die 124 and 276, are electrically connected to external devices through build-up interconnect structures 306 and 320. Within individual packages 324, first and second encapsulants 266 and 282 are selected to be compatible with each another. The viscosity and CTE of second encapsulant 282 are selected for uniform coverage and to minimize flowability issues and warpage during in-mold cure. Temperature during the in-mold cure is controlled to prevent excess stress from developing in conductive posts 246 that would compromise integrity of the conductive posts. Temperature during the in-mold cure is further controlled to prevent excess stress among subsequently formed bumps. To prevent a problem of semiconductor die 124 and 276 from shifting with respect to each other during mounting, thereby creating alignment problems for subsequent build-up interconnect layers including RDL and insulating layers, adhesives 264 and 278 include backside coatings and laminates that eliminate movement and sliding of semiconductor die 124 and 276 with respect to each other during semiconductor die attachment.

Individual packages 324 also provide a number of additional benefits. Warpage is reduced by the use of copper carrier 138 that stiffens the reconfigured wafer during processing. The formation of conductive posts 246, by filling vias 236 in copper carrier 138 with conductive material, is a simple, stable, and cost-effective method for forming z-direction electrical interconnects within a reconfigured stackable wafer level package. A diameter of conductive posts 246 can be made larger, and at a reduced cost, with respect to vias formed by a laser in a conventional molded package or TSV process. Furthermore, a pre-fabricated copper carrier with conductive posts can be outsourced to, and made by, a leadframe manufacturing factory, thereby improving quality, reducing production cycle-time, increasing capacity, and reducing overall cost for semiconductor die packaging.

Figure 7G:
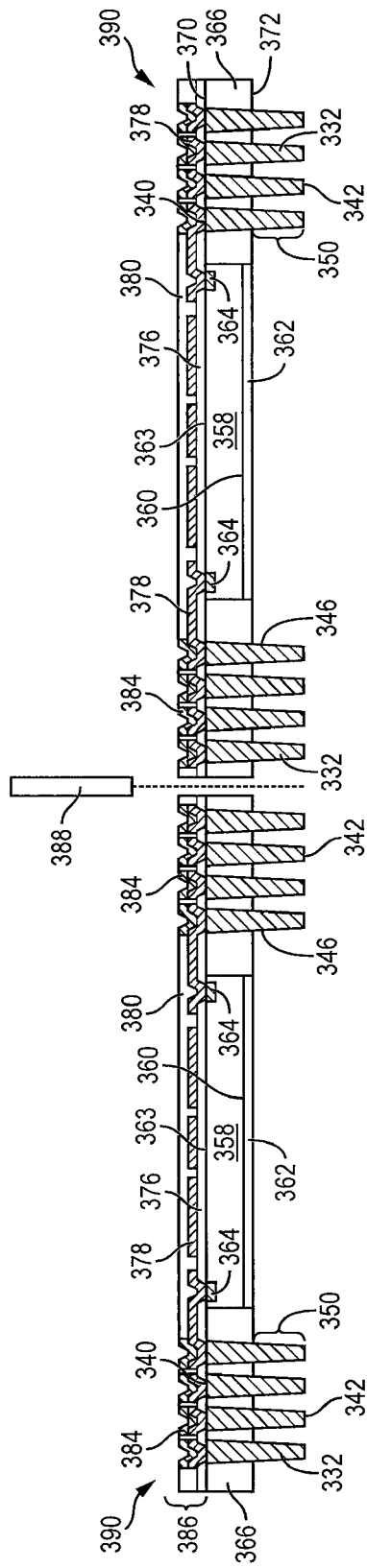

FIGS. 7a-7g illustrate another process of using a copper carrier to form a reconfigured stackable wafer level package with conductive posts. FIG. 7a, similar to FIG. 6d, shows a cross-sectional view of a portion of copper carrier 330. FIG. 7a shows copper carrier 330, after the formation of conductive posts, pillars, or vias 332 and after the removal of masking layers from over first surface 334 and second surface 336 of the copper carrier. Copper carrier 330 also includes a plurality of semiconductor die mounting areas 338 that have areas of sufficient size to receive later mounted semiconductor die.

In FIG. 7a, conductive posts 332 are Al, Cu, Sn, Ni, Au, Ag, Ti, W, poly-silicon, conductive paste, high temperature solder material, or other suitable electrically conductive material using PVD, CVD, electrolytic plating, electroless plating process, or other suitable metal deposition process to form conductive posts 332. In one embodiment, conductive posts 332 are Ni formed by electrolytic plating. By forming conductive posts 332 in copper carrier 330, a diameter of the conductive posts can be made larger than vias formed by a laser in a conventional molded package or TSV process and at a reduced cost. Forming conductive posts 332 without excessive cost and with the larger diameter provides a cost effective method for manufacturing conductive posts that can also function as package level I/O interconnects. Conductive posts 332 include a first surface 340 and a second surface 342 opposite the first surface. First surface 340 is substantially coplanar with first surface 334 of copper carrier 330 and second surface 342 is substantially coplanar with second surface 336 of copper carrier 330. First and second surfaces 340 and 342 of conductive posts 332 are planar and provide for subsequent z-direction electrical interconnect for a reconfigured stackable wafer level package.

In FIG. 7b, a first portion of copper carrier 330 is removed. In one embodiment, the first portion of copper carrier 330 is removed isotropically by an alkali etchant using a pressurized spray etching. The removal of the first portion of copper carrier 330 exposes sidewalls 346 of conductive posts 332. Sidewalls 346 extend from first surface 340 to second surface 342 of conductive posts 332. Sidewalls 346 are angled or tapered. Alternatively, sidewalls 346 can be parallel with respect to each other and orthogonal with respect to first and second surfaces 340 and 342 of conductive posts 332. The first portion of copper carrier 330 is removed from first surface 334 partially but not completely through copper carrier 330. In addition to exposing sidewalls 346, the removal of the first portion of copper carrier 330 exposes a third surface 348 of carrier 330. Third surface 348 is between first surface 340 and second surface 342 of conductive post 332. Third surface 348 is parallel with respect to first and second surfaces 334 and 336 of copper carrier 330.

A base portion 350 of conductive posts 332 remains attached to, and surrounded by, copper carrier 330 after the removal of the first portion of the copper carrier because third surface 348 of carrier 330 is between first surface 340 and second surface 342 of conductive post 332. Removal of copper carrier 330 between first surface 334 and third surface 348 by the alkali etchant occurs progressively and is controlled to not remove material, e.g. nickel, from conductive posts 332. The amount of copper removed from copper carrier 330 in the etch process is controlled through belt speed, etch solution spray pressure, etch solution temperature, etch solution concentration, and etch solution pH. The controlled removal of the first portion of copper carrier 330 between first surface 334 and third surface 348 prevents over-etching and ensures that the interface between base 350 and copper carrier 330 remains secure, and does not loosen or increase a risk of premature separation between conductive posts 332 and the copper carrier. The controlled removal of the first portion of copper carrier 330 is similar to copper etching technology in the controlled removal of material from a QFNs-st and a QFNs-se. Exposing third surface 348 results in carrier 354 having conductive posts 332 with exposed sidewalls 346 and base portions 350 embedded in copper carrier 330.

While the steps from FIGS. 7a and 7b of forming carrier 354 can be performed in conjunction with the packaging of semiconductor die, alternatively, carrier 354 can be supplied as a pre-fabricated unit made at a leadframe manufacturing factory. Outsourcing the steps described in FIGS. 7a and 7b can improve quality, reduce production cycle-time, increase capacity, and reduce overall cost with respect to semiconductor die packaging. Furthermore, the formation of conductive posts 332 in copper carrier 330 is a simple, stable, and cost-effective method for forming z-direction electrical interconnects within a reconfigured stackable wafer level package. Formation of vias with the use of lasers in silicon or in a molded reconfigured package body, together with the filling or plating of the laser formed vias, increases cost and cycle-time with respect to the method shown in FIGS. 7a and 7b.

Use of the method shown in FIGS. 7a-7b, especially with vias having large diameters that are entirely filled with conductive material, yield increased savings of cost and cycle-time.

In FIG. 7c, semiconductor die 358, similar to semiconductor die 124 from FIGS. 3a-3c, are positioned over semiconductor die mounting areas 338 with back surfaces 360 and adhesive 362 aligned over and oriented toward copper carrier 330. Semiconductor die 358, similar to semiconductor die 124, include active surfaces 363 with contact pads 364 formed opposite back surface 360. FIG. 7c further shows semiconductor die 358 mounted to semiconductor die mounting area 338 between conductive posts 332 with die attach adhesive 362, as part of a reconstituted or reconfigured wafer level package. Adhesive 362 includes a die attach adhesive, epoxy, or other adhesive material.

In FIG. 7d, an encapsulant or molding compound 366 is deposited over copper carrier 330, around semiconductor die 358, and around conductive posts 332 using a paste printing, compressive molding, transfer molding, liquid encapsulant molding, vacuum lamination, spin coating, or other suitable applicator. Encapsulant 366 can be polymer composite material, such as epoxy resin with filler, epoxy acrylate with filler, or polymer with proper filler. The viscosity of encapsulant 366 is selected for uniform coverage, e.g., a lower viscosity increases the flow of the encapsulant. Encapsulant 366 is non-conductive and environmentally protects the semiconductor device from external elements and contaminants. First surface 340 of conductive posts 332 and active surface 363 of semiconductor die 358 are substantially coplanar with first surface 370 of encapsulant 366. A second surface 372 of encapsulant 366 is formed opposite first surface 370 of the encapsulant and contacts third surface 348 of copper carrier 330.

Active surface 363 of semiconductor die 358 including a plurality of contact pads 364 are shown surrounded by encapsulant 366 and conductive posts 332. Conductive posts 332 are formed in a periphery of semiconductor die 358 to provide for electrical z-direction interconnect by extending from first surface 370 of encapsulant 366 past second surface 372 of the encapsulant. Saw streets 375 extend through encapsulant 366, and are formed outside a footprint of the periphery of semiconductor die 358 occupied by conductive posts 332.

By using only conductive posts 332 for electrical interconnect between semiconductor contact pads 364 and second surface 372 of encapsulant 366, the number of electrical connections is limited with respect to embodiments including additional vertical interconnects such as bond wires. However, for applications requiring a number of vertical interconnects that are compatible with the available number of conductive posts 332, larger less expensive z-direction vertical interconnects are available by forming conductive posts 332 in copper carrier 330 as described. Common devices, such as QFNs-st, have a number of I/O connections that are compatible with a number of conductive posts 332 that are formed as part of the reconstituted wafer. For example, MT6253, a QFNs-st with an area of 11.5 mm×11.5 mm, includes 261 leads at 0.4 mm lead pitch, in which many of the leads are depopulated. Accordingly, MT6253 and other similar devices that do not include an excessive number of I/Os are compatible with the number of z-directional interconnects provided by conductive posts 332.

In FIG. 7e, an insulating or passivation layer 376 is formed over first surface 370 of encapsulant 366, over first surface 340 of conductive post 322, and over active surface 363 of semiconductor die 358 using PVD, CVD, printing, spin coating, spray coating, sintering or thermal oxidation. The insulating layer 376 contains one or more layers of SiO2, Si3N4, SiON, Ta2O5, Al2O3, or other material having similar insulating and structural properties. A portion of insulating layer 376 is removed by an etching process to expose contact pads 364 and first surface 340 of conductive posts 322.

An electrically conductive layer or RDL 378 is formed over and follows the contours of insulating layer 376. Conductive layer 378 is further formed over exposed contact pads 364 and the exposed first surfaces 340 of conductive posts 332 using a patterning and metal deposition process such as printing, PVD, CVD, sputtering, electrolytic plating, and electroless plating. Conductive layer 378 can be one or more layers of Al, Cu, Sn, Ni, Au, Ag, or other suitable electrically conductive material. Conductive layer 378 is electrically connected to contact pads 364 and conductive posts 332 according to the design and function of semiconductor die 358.

An insulating or passivation layer 380 is formed over and follows the contours of insulating layer 376 and conductive layer 378 using PVD, CVD, printing, spin coating, spray coating, sintering or thermal oxidation. The insulating layer 380 contains one or more layers of SiO2, Si3N4, SiON, Ta2O5, Al2O3, or other material having similar insulating and structural properties.

Because warpage is expected throughout the process of wafer integration, and particularly during formation of RDLs and corresponding insulating layers, thicknesses of semiconductor die 358, encapsulant 366, conductive posts 332, and conductive and insulating layers including layers 376, 378, and 380 are calibrated to reduce warpage of the reconstituted or reconfigured wafer level package. Furthermore, the use of copper carrier 330 stiffens the reconfigured wafer during processing to alleviate handling issues that may create additional warpage of the reconfigured wafer.

In FIG. 7f, insulating layer 380 serves as a masking layer to protect active surface 363 of semiconductor die 358 during the removal of the remaining portion of copper carrier 330 that extends between second and third surfaces 336 and 348 of copper carrier 330. In one embodiment, the remaining portion of copper carrier 330 is removed isotropically by an alkali etchant using a pressurized spray etching. The removal of the remaining portion of copper carrier 330 exposes bases 350 of conductive posts 332, and further exposes second surface 372 of encapsulant 366. Bases 350 of conductive posts 332 are vertically offset from and are not coplanar with encapsulant 366. Accordingly, bases 350 protrude from second surface 372 and act as an interconnect structure to electrically connect semiconductor die 358 to external devices through conductive posts 332. Bases 350, when used as interconnect structures with respect to external devices, are suitable for applications requiring fine pitch.

In FIG. 7g, after the removal of the remaining portion of copper carrier 330, a portion of insulating layer 380 is removed to expose a portion of conductive layer 378. An electrically conductive layer or RDL 384 is formed over, and follows the contours of, insulating layer 380. Conductive layer 384 is further formed over exposed conductive layer 378 using a patterning and metal deposition process such as printing, PVD, CVD, sputtering, electrolytic plating, and electroless plating. Conductive layer 384 can be one or more layers of Al, Cu, Sn, Ni, Au, Ag, or other suitable electrically conductive material. Conductive layer 384 is electrically connected to conductive layer 378 for the routing of electrical signals vertically and laterally across the reconstituted wafer according to the design and function of semiconductor die 358. The combination of conductive layers 378 and 384, and insulating layers 376 and 378 constitute build-up interconnect structure 386.

In FIG. 7g, the reconstituted or reconfigured wafer level package is singulated through saw street 375 and build-up interconnect structure 386 with saw blade or laser cutting tool 388 into individual stackable wafer level packages with conductive posts 390. Individual packages 390, including semiconductor die 358, are electrically connected to external devices through build-up interconnect structure 386, and through conductive posts 332.

Individual packages 390 also provide a number of additional benefits. Warpage is reduced by the use of copper carrier 330 that stiffens the reconfigured wafer during processing. The formation of conductive posts 332, by filling vias formed in copper carrier 330 with conductive material, is a simple, stable, and cost-effective method for forming z-direction electrical interconnects within a reconfigured stackable wafer level package. A diameter of conductive posts 332 can be made larger, and at a reduced cost, with respect to vias formed by a laser in a conventional molding package or TSV process. Conductive posts can also function as package level I/O interconnects in fine pitch applications. Furthermore, a pre-fabricated copper carrier with conductive posts can be outsourced to, and made by, a leadframe manufacturing factory, thereby improving quality, reducing production cycle-time, increasing capacity, and reducing overall cost for semiconductor die packaging.

Figure 8:
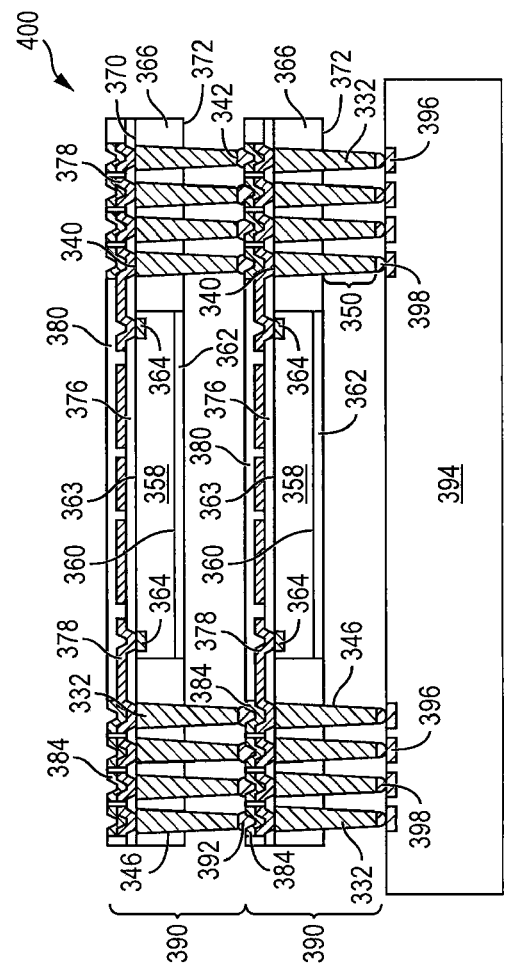
FIG. 8 illustrates a PoP arrangement of multiple packages having conductive posts for vertical package interconnect.

FIG. 8 shows a number of individual stackable wafer level packages with conductive posts 390 mounted one above another with bumps 392. Bumps 392 are formed by depositing an electrically conductive bump material over conductive layer 384 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 384 using a suitable attachment or bonding process. In one embodiment, the bump material is reflowed by heating the material above its melting point to form balls or bumps 392. In some applications, bumps 392 are reflowed a second time to improve electrical contact to conductive layer 384. A UBM layer can be formed under bumps 392. Bumps 392 can also be compression bonded to conductive layer 384. Bumps 392 represent one type of interconnect structure that can be formed over conductive layer 384. The interconnect structure can also include other electrical interconnects.

Similarly, individual packages 390 are further mounted to a substrate or carrier 394 including traces 396 with bumps 398 to form a PoP configuration 400. Bumps 398 are formed by depositing an electrically conductive bump material over conductive traces 396 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to traces 396 using a suitable attachment or bonding process. In one embodiment, the bump material is reflowed by heating the material above its melting point to form balls or bumps 398. In some applications, bumps 398 are reflowed a second time to improve electrical contact to traces 396. A UBM layer can be formed under bumps 398. Bumps 398 can also be compression bonded to traces 396. Bumps 398 represent one type of interconnect structure that can be formed over traces 396. The interconnect structure can also include other electrical interconnects.

PoP 400 is formed by mounting individual packages 390 one above the other after the packages have been singulated. Alternatively, packages 390 are mounted one above the other at the reconstituted wafer level before singulation, and then are subsequently singulated to form multiple PoPs 400. In both instances, bases 350 of conductive posts 332 function as package level I/O interconnects for both individual packages 390 and for PoP 400. A standoff distance among individual packages 390 and substrate 394 is controlled by adjusting a height of bases 350. A height of bases 350 is controlled in order to optimize results for board level reliability tests (BL-RTs) including temper-cycling on board (TCoB) tests.

PoPs 400 also provide a number of additional benefits. Warpage is reduced by the use of copper carrier 330 that stiffens the reconfigured wafer during processing. The formation of conductive posts 332 by filling vias in copper carrier 330 with conductive material is a simple, stable, and cost-effective method for forming z-direction electrical interconnects within a reconfigured stackable wafer level package. A diameter of conductive posts 332 can be made larger, and at a reduced cost, with respect to vias formed by a laser in a conventional molded package or TSV process. Conductive posts can also function as package level I/O interconnects. Furthermore, a pre-fabricated copper carrier with conductive posts can be outsourced to, and made by, a leadframe manufacturing factory, thereby improving quality, reducing production cycle-time, increasing capacity, and reducing overall cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   forming a plurality of conductive posts partially through and embedded within the carrier such that the conductive posts terminate at a surface of the carrier;
   removing a portion of the carrier to expose a first portion of a sidewall of the conductive posts while a second portion of the sidewall of the conductive posts remains embedded in the carrier;
   disposing a first semiconductor die over a semiconductor die mounting area of the carrier between the conductive posts;
   depositing a first encapsulant around the first semiconductor die and around the conductive posts with a surface of the first encapsulant opposite the carrier coplanar with a surface of the first semiconductor die and a first surface of the conductive posts;
   removing the carrier to expose the second portion of the sidewall of the conductive posts and a second surface of the conductive posts; and
   forming a first interconnect structure over the second surface of the conductive posts, first encapsulant, and first semiconductor die after depositing the first encapsulant.

2. The method of claim 1, wherein the carrier includes copper.

3. The method of claim 1, wherein forming the first interconnect structure includes:
   forming a first insulating layer over the first encapsulant, the conductive posts, and the first semiconductor die;
   forming a conductive layer over the first insulating layer; and forming a second insulating layer over the conductive layer and first insulating layer.

4. The method of claim 1, further including:
disposing a second semiconductor die over the first semiconductor die; and
depositing a second encapsulant around the second semiconductor die.

5. The method of claim 1, wherein the conductive posts include conductive paste or high-melting solder.

6. The method of claim 1, further including stacking a plurality of the semiconductor devices electrically connected through the conductive posts.

7. The method of claim 1, further including forming a second interconnect structure over the first semiconductor die, first encapsulant, and conductive posts opposite the first interconnect structure.

8. A method of making a semiconductor device, comprising:
providing a carrier;
forming a plurality of conductive posts embedded within the carrier;
removing a portion of the carrier to expose a first portion of a sidewall of the conductive posts;
disposing a first semiconductor die over a semiconductor die mounting area of the carrier between the conductive posts;
depositing a first encapsulant around the first semiconductor die and around the conductive posts with a surface of the first encapsulant opposite the carrier coplanar with a surface of the first semiconductor die and a surface of the conductive posts;
removing a remainder of the carrier to expose a second portion of the sidewall of the conductive posts; and
forming a first interconnect structure over the conductive posts, first encapsulant, and first semiconductor die.

9. The method of claim 8, wherein the carrier includes copper.

10. The method of claim 8, wherein forming the first interconnect structure includes:
forming a first insulating layer over the first encapsulant, the conductive posts, and the first semiconductor die;
forming a conductive layer over the first insulating layer; and
forming a second insulating layer over the conductive layer and first insulating layer.

11. The method of claim 8, further including:
disposing a second semiconductor die over the first semiconductor die; and
depositing a second encapsulant around the second semiconductor die and around the conductive posts.

12. The method of claim 8, wherein the conductive posts include conductive paste or high-melting solder.

13. The method of claim 8, further including stacking a plurality of the semiconductor devices electrically connected through the conductive posts.

14. The method of claim 8, further including forming a masking layer over the first semiconductor die.

15. The method of claim 8, further including forming a second interconnect structure over the first semiconductor die, first encapsulant, and conductive posts opposite the first interconnect structure.

16. A method of making a semiconductor device, comprising:
providing a carrier;
forming a plurality of conductive posts embedded within the carrier;
removing a portion of the carrier to expose a sidewall of the conductive posts while a portion of the conductive posts remains embedded in the carrier;
disposing a first semiconductor die over the carrier;
depositing a first encapsulant around the first semiconductor die and around the conductive posts with a surface of the first encapsulant opposite the carrier coplanar with a surface of the first semiconductor die and the conductive posts;
removing a remainder of the carrier; and
forming a first interconnect structure over the conductive posts, first encapsulant, and first semiconductor die.

17. The method of claim 16, wherein the carrier includes copper.

18. The method of claim 16, further including:
disposing a second semiconductor die over the first semiconductor die; and
depositing a second encapsulant around the second semiconductor die.

19. The method of claim 16, wherein the conductive posts include conductive paste or high-melting solder.

20. The method of claim 16, further including stacking a plurality of the semiconductor devices electrically connected through the conductive posts.

21. The method of claim 16, further including forming a masking layer over the first semiconductor die.

22. The method of claim 16, further including forming a second interconnect structure over the first semiconductor die, first encapsulant, and conductive posts opposite the first interconnect structure.

23. A method of making a semiconductor device, comprising:
providing a carrier;
forming a plurality of conductive posts embedded within the carrier;
removing a portion of the carrier to expose a portion of the conductive posts;
disposing a first semiconductor die over the carrier;
depositing a first encapsulant around the first semiconductor die and around the conductive posts with a surface of the first encapsulant coplanar with a surface of the first semiconductor die and the conductive posts;
removing a remainder of the carrier; and
forming a first interconnect structure over the first semiconductor die, first encapsulant, and conductive posts.

24. The method of claim 23, wherein the carrier includes copper.

25. The method of claim 23, further including:
disposing a second semiconductor die over the first semiconductor die; and
depositing a second encapsulant over the second semiconductor die.

26. The method of claim 23, wherein the conductive posts include conductive paste or high-melting solder.

27. The method of claim 23, further including stacking a plurality of the semiconductor devices electrically connected through the conductive posts.

28. The method of claim 23, further including forming a second interconnect structure over the first semiconductor die, first encapsulant, and conductive posts opposite the first interconnect structure.

* * * * *